(12) United States Patent
Zur

(10) Patent No.: US 9,575,140 B2
(45) Date of Patent: Feb. 21, 2017

(54) MAGNETIC INTERFERENCE DETECTION SYSTEM AND METHOD

(75) Inventor: Oded Zur, Kochav-Ya'ir Zur Yigal (IL)

(73) Assignee: COVIDIEN LP, Mansfield, MA (US)

( * ) Notice: Subject to any disclaimer, the term of this patent is extended or adjusted under 35 U.S.C. 154(b) by 383 days.

(21) Appl. No.: 12/417,381

(22) Filed: Apr. 2, 2009

(65) Prior Publication Data
US 2009/0284255 A1 Nov. 19, 2009

Related U.S. Application Data

(60) Provisional application No. 61/042,191, filed on Apr. 3, 2008, provisional application No. 61/042,578, filed on Apr. 4, 2008.

(51) Int. Cl.
*A61B 5/05* (2006.01)
*G01R 33/04* (2006.01)

(52) U.S. Cl.
CPC ..................................... *G01R 33/04* (2013.01)

(58) Field of Classification Search
CPC ..... G01B 7/0023; G01B 7/14; A61B 19/5244; A61B 5/06; A61B 5/061; A61B 5/062; A61B 5/063; A61B 5/065
USPC ......................................... 324/207.2, 207.17
See application file for complete search history.

(56) References Cited

U.S. PATENT DOCUMENTS

| 1,576,781 A | 3/1926 | Phillips |
| 1,735,726 A | 11/1929 | Bornhardt |
| 2,407,845 A | 9/1946 | Nemeyer |
| 2,650,588 A | 9/1953 | Drew |
| 2,697,433 A | 12/1954 | Sehnder |
| 3,016,899 A | 1/1962 | Stenvall |
| 3,017,887 A | 1/1962 | Heyer |
| 3,061,936 A | 11/1962 | Dobbeleer |
| 3,073,310 A | 1/1963 | Mocarski |
| 3,109,588 A | 11/1963 | Polhemus et al. |
| 3,121,228 A | 2/1964 | Kalmus |
| 3,294,083 A | 12/1966 | Alderson |
| 3,367,326 A | 2/1968 | Frazier |
| 3,439,256 A | 4/1969 | Kahne et al. |
| 3,519,436 A | 7/1970 | Bauer et al. |
| 3,577,160 A | 5/1971 | White |
| 3,600,625 A | 8/1971 | Tsuneta et al. |
| 3,605,725 A | 9/1971 | Bentov |

(Continued)

FOREIGN PATENT DOCUMENTS

| CA | 964149 | 3/1975 |
| DE | 3508730 | 9/1986 |

(Continued)

OTHER PUBLICATIONS

Higgins, W.E. et al., "3D CT-Video Fusion for Image-Guided Bronchoscopy," *Comput Med Imaging Graph* Apr. 2008; 32(3) :159-73, 30 pages.

(Continued)

*Primary Examiner* — David M. Schindler

(57) ABSTRACT

A system and method for tracking an object through a three dimensional space is provided that uses the generation and detection of various magnetic fields to provide three-dimensional location data. The integrity of the generated magnetic fields are monitored against a baseline in order to detect compromise by the unintentional introduction of a foreign metallic or magnetic object in the procedural space.

14 Claims, 6 Drawing Sheets

(56) References Cited

U.S. PATENT DOCUMENTS

| | | |
|---|---|---|
| 3,614,950 A | 10/1971 | Rabey |
| 3,644,825 A | 2/1972 | Davis, Jr. et al. |
| 3,674,014 A | 7/1972 | Tillander |
| 3,702,935 A | 11/1972 | Carey et al. |
| 3,704,707 A | 12/1972 | Halloran |
| 3,821,469 A | 6/1974 | Whetstone et al. |
| 3,822,697 A | 7/1974 | Komiya |
| 3,868,565 A | 2/1975 | Kuipers |
| 3,941,127 A | 3/1976 | Froning |
| 3,983,474 A | 9/1976 | Kuipers |
| 4,017,858 A | 4/1977 | Kuipers |
| 4,037,592 A | 7/1977 | Kronner |
| 4,052,620 A | 10/1977 | Brunnett |
| 4,054,881 A | 10/1977 | Raab |
| 4,117,337 A | 9/1978 | Staats |
| 4,135,184 A | 1/1979 | Pruzick |
| 4,173,228 A | 11/1979 | Van Steenwyk et al. |
| 4,182,312 A | 1/1980 | Mushabac |
| 4,202,349 A | 5/1980 | Jones |
| 4,228,799 A | 10/1980 | Anichkov et al. |
| 4,249,167 A | 2/1981 | Purinton et al. |
| 4,256,112 A | 3/1981 | Kopf et al. |
| 4,262,306 A | 4/1981 | Renner |
| 4,287,809 A | 9/1981 | Egli et al. |
| 4,298,874 A | 11/1981 | Kuipers |
| 4,308,530 A | 12/1981 | Kip et al. |
| 4,314,251 A | 2/1982 | Raab |
| 4,317,078 A | 2/1982 | Weed et al. |
| 4,319,136 A | 3/1982 | Jinkins |
| 4,328,548 A | 5/1982 | Crow et al. |
| 4,328,813 A | 5/1982 | Ray |
| 4,339,953 A | 7/1982 | Iwasaki |
| 4,341,220 A | 7/1982 | Perry |
| 4,341,385 A | 7/1982 | Doyle et al. |
| 4,346,384 A | 8/1982 | Raab |
| 4,358,856 A | 11/1982 | Stivender et al. |
| 4,368,536 A | 1/1983 | Pfeiler |
| 4,394,831 A | 7/1983 | Egli et al. |
| 4,396,885 A | 8/1983 | Constant |
| 4,396,945 A | 8/1983 | DiMatteo et al. |
| 4,403,321 A | 9/1983 | Kruger |
| 4,418,422 A | 11/1983 | Richter et al. |
| 4,419,012 A | 12/1983 | Stephenson et al. |
| 4,422,041 A | 12/1983 | Lienau |
| 4,425,511 A | 1/1984 | Brosh |
| 4,431,005 A | 2/1984 | McCormick |
| 4,447,224 A | 5/1984 | Decant, Jr. et al. |
| 4,447,462 A | 5/1984 | Tafuri et al. |
| 4,485,815 A | 12/1984 | Amplatz |
| 4,506,676 A | 3/1985 | Duska |
| 4,543,959 A | 10/1985 | Sepponen |
| 4,548,208 A | 10/1985 | Niemi |
| 4,571,834 A | 2/1986 | Fraser et al. |
| 4,572,198 A | 2/1986 | Codrington |
| 4,583,538 A | 4/1986 | Onik et al. |
| 4,584,577 A | 4/1986 | Temple |
| 4,586,491 A | 5/1986 | Carpenter |
| 4,587,975 A | 5/1986 | Salo et al. |
| 4,608,977 A | 9/1986 | Brown |
| 4,613,866 A | 9/1986 | Blood |
| 4,617,925 A | 10/1986 | Laitinen |
| 4,618,978 A | 10/1986 | Cosman |
| 4,621,628 A | 11/1986 | Budermann |
| 4,625,718 A | 12/1986 | Olerud et al. |
| 4,638,798 A | 1/1987 | Shelden et al. |
| 4,642,786 A | 2/1987 | Hansen |
| 4,645,343 A | 2/1987 | Stockdale et al. |
| 4,649,504 A | 3/1987 | Krouglicof et al. |
| 4,651,732 A | 3/1987 | Frederick |
| 4,653,509 A | 3/1987 | Oloff et al. |
| 4,659,971 A | 4/1987 | Suzuki et al. |
| 4,660,970 A | 4/1987 | Ferrano |
| 4,673,352 A | 6/1987 | Hansen |
| 4,686,695 A | 8/1987 | Macovski |
| 4,688,037 A | 8/1987 | Krieg |
| 4,696,544 A | 9/1987 | Costella |
| 4,697,595 A | 10/1987 | Breyer et al. |
| 4,701,049 A | 10/1987 | Beckmann et al. |
| 4,704,602 A | 11/1987 | Asbrink |
| 4,705,395 A | 11/1987 | Hageniers |
| 4,705,401 A | 11/1987 | Addleman et al. |
| 4,706,665 A | 11/1987 | Gouda |
| 4,709,156 A | 11/1987 | Murphy et al. |
| 4,710,708 A | 12/1987 | Rorden et al. |
| 4,719,419 A | 1/1988 | Dawley |
| 4,722,056 A | 1/1988 | Roberts et al. |
| 4,722,336 A | 2/1988 | Kim et al. |
| 4,723,544 A | 2/1988 | Moore et al. |
| 4,726,355 A | 2/1988 | Okada |
| 4,727,565 A | 2/1988 | Ericson |
| RE32,619 E | 3/1988 | Damadian |
| 4,733,969 A | 3/1988 | Case et al. |
| 4,737,032 A | 4/1988 | Addleman et al. |
| 4,737,794 A | 4/1988 | Jones |
| 4,737,921 A | 4/1988 | Goldwasser et al. |
| 4,742,356 A | 5/1988 | Kuipers |
| 4,742,815 A | 5/1988 | Ninan et al. |
| 4,743,770 A | 5/1988 | Lee |
| 4,743,771 A | 5/1988 | Sacks et al. |
| 4,745,290 A | 5/1988 | Frankel et al. |
| 4,750,487 A | 6/1988 | Zanetti |
| 4,753,528 A | 6/1988 | Hines et al. |
| 4,761,072 A | 8/1988 | Pryor |
| 4,764,016 A | 8/1988 | Johansson |
| 4,771,787 A | 9/1988 | Wurster et al. |
| 4,779,212 A | 10/1988 | Levy |
| 4,782,239 A | 11/1988 | Hirose et al. |
| 4,784,117 A | 11/1988 | Miyazaki |
| 4,788,481 A | 11/1988 | Niwa |
| 4,791,934 A | 12/1988 | Brunnett |
| 4,793,355 A | 12/1988 | Crum et al. |
| 4,794,262 A | 12/1988 | Sato et al. |
| 4,797,907 A | 1/1989 | Anderton |
| 4,803,976 A | 2/1989 | Frigg et al. |
| 4,804,261 A | 2/1989 | Kirschen |
| 4,805,615 A | 2/1989 | Carol |
| 4,809,694 A | 3/1989 | Ferrara |
| 4,821,200 A | 4/1989 | Oberg |
| 4,821,206 A | 4/1989 | Arora |
| 4,821,731 A | 4/1989 | Martinelli et al. |
| 4,822,163 A | 4/1989 | Schmidt |
| 4,825,091 A | 4/1989 | Breyer et al. |
| 4,829,250 A | 5/1989 | Rotier |
| 4,829,373 A | 5/1989 | Leberl et al. |
| 4,836,778 A | 6/1989 | Baumrind et al. |
| 4,838,265 A | 6/1989 | Cosman et al. |
| 4,841,967 A | 6/1989 | Chang et al. |
| 4,845,771 A | 7/1989 | Wislocki et al. |
| 4,849,692 A | 7/1989 | Blood |
| 4,860,331 A | 8/1989 | Williams et al. |
| 4,862,893 A | 9/1989 | Martinelli |
| 4,869,247 A | 9/1989 | Howard, III et al. |
| 4,875,165 A | 10/1989 | Fencil et al. |
| 4,875,478 A | 10/1989 | Chen |
| 4,884,566 A | 12/1989 | Mountz et al. |
| 4,889,526 A | 12/1989 | Rauscher et al. |
| 4,896,673 A | 1/1990 | Rose et al. |
| 4,905,698 A | 3/1990 | Strohl et al. |
| 4,923,459 A | 5/1990 | Nambu |
| 4,931,056 A | 6/1990 | Ghajar et al. |
| 4,945,305 A | 7/1990 | Blood |
| 4,945,912 A | 8/1990 | Langberg |
| 4,945,914 A | 8/1990 | Allen |
| 4,951,653 A | 8/1990 | Fry et al. |
| 4,955,891 A | 9/1990 | Carol |
| 4,961,422 A | 10/1990 | Marchosky et al. |
| 4,977,655 A | 12/1990 | Martinelli |
| 4,989,608 A | 2/1991 | Ratner |
| 4,991,579 A | 2/1991 | Allen |
| 5,002,058 A | 3/1991 | Martinelli |
| 5,005,592 A | 4/1991 | Cartmell |
| 5,013,047 A | 5/1991 | Schwab |
| 5,013,317 A | 5/1991 | Cole et al. |
| 5,016,639 A | 5/1991 | Allen |

(56) References Cited

U.S. PATENT DOCUMENTS

| | | |
|---|---|---|
| 5,017,139 A | 5/1991 | Mushabac |
| 5,023,102 A | 6/1991 | Given |
| 5,027,818 A | 7/1991 | Bova et al. |
| 5,030,196 A | 7/1991 | Inoue |
| 5,030,222 A | 7/1991 | Calandruccio et al. |
| 5,031,203 A | 7/1991 | Trecha |
| RE33,662 E | 8/1991 | Blair et al. |
| 5,042,486 A | 8/1991 | Pfeiler et al. |
| 5,047,036 A | 9/1991 | Koutrouvelis |
| 5,050,608 A | 9/1991 | Watanabe et al. |
| 5,054,492 A | 10/1991 | Scribner et al. |
| 5,057,095 A | 10/1991 | Fabian |
| 5,059,789 A | 10/1991 | Salcudean |
| 5,070,462 A | 12/1991 | Chau |
| 5,078,140 A | 1/1992 | Kwoh |
| 5,079,699 A | 1/1992 | Tuy et al. |
| 5,082,286 A | 1/1992 | Ryan et al. |
| 5,086,401 A | 2/1992 | Glassman et al. |
| 5,088,928 A | 2/1992 | Chan |
| 5,094,241 A | 3/1992 | Allen |
| 5,097,839 A | 3/1992 | Allen |
| 5,098,426 A | 3/1992 | Sklar et al. |
| 5,099,845 A | 3/1992 | Besz et al. |
| 5,099,846 A | 3/1992 | Hardy |
| 5,104,393 A | 4/1992 | Isner et al. |
| 5,105,829 A | 4/1992 | Fabian et al. |
| 5,107,839 A | 4/1992 | Houdek et al. |
| 5,107,843 A | 4/1992 | Aarnio et al. |
| 5,107,862 A | 4/1992 | Fabian et al. |
| 5,109,194 A | 4/1992 | Cantaloube |
| 5,119,817 A | 6/1992 | Allen |
| 5,127,408 A | 7/1992 | Parsons et al. |
| 5,129,654 A | 7/1992 | Bogner |
| 5,142,930 A | 9/1992 | Allen et al. |
| 5,143,076 A | 9/1992 | Hardy et al. |
| 5,152,277 A | 10/1992 | Honda et al. |
| 5,152,288 A | 10/1992 | Hoenig et al. |
| 5,160,337 A | 11/1992 | Cosman |
| 5,161,536 A | 11/1992 | Vikomerson et al. |
| 5,178,130 A | 1/1993 | Kaiya |
| 5,178,164 A | 1/1993 | Allen |
| 5,178,621 A | 1/1993 | Cook et al. |
| 5,186,174 A | 2/1993 | Schlondorff et al. |
| 5,187,475 A | 2/1993 | Wagener et al. |
| 5,188,126 A | 2/1993 | Fabian et al. |
| 5,188,368 A | 2/1993 | Ryan |
| 5,190,059 A | 3/1993 | Fabian et al. |
| 5,190,285 A | 3/1993 | Levy et al. |
| 5,193,106 A | 3/1993 | DeSena |
| 5,196,928 A | 3/1993 | Karasawa et al. |
| 5,197,476 A | 3/1993 | Nowacki et al. |
| 5,197,965 A | 3/1993 | Cherry et al. |
| 5,198,768 A | 3/1993 | Keren |
| 5,198,877 A | 3/1993 | Schulz |
| 5,203,337 A | 4/1993 | Feldman |
| 5,207,688 A | 5/1993 | Carol |
| 5,211,164 A | 5/1993 | Allen |
| 5,211,165 A | 5/1993 | Dumoulin et al. |
| 5,211,176 A | 5/1993 | Ishiguro et al. |
| 5,212,720 A | 5/1993 | Landi et al. |
| 5,214,615 A | 5/1993 | Bauer |
| 5,219,351 A | 6/1993 | Teubner et al. |
| 5,222,499 A | 6/1993 | Allen et al. |
| 5,224,049 A | 6/1993 | Mushabac |
| 5,228,442 A | 7/1993 | Imran |
| 5,230,338 A | 7/1993 | Allen et al. |
| 5,230,623 A | 7/1993 | Guthrie et al. |
| 5,233,990 A | 8/1993 | Barnea |
| 5,237,996 A | 8/1993 | Waldman et al. |
| 5,249,581 A | 10/1993 | Horbal et al. |
| 5,251,127 A | 10/1993 | Raab |
| 5,251,635 A | 10/1993 | Dumoulin et al. |
| 5,253,647 A * | 10/1993 | Takahashi et al. ............ 600/424 |
| 5,255,680 A | 10/1993 | Darrow et al. |
| 5,257,636 A | 11/1993 | White |
| 5,257,998 A | 11/1993 | Ota et al. |
| 5,261,404 A | 11/1993 | Mick et al. |
| 5,262,722 A | 11/1993 | Hedengren et al. |
| 5,265,610 A | 11/1993 | Darrow et al. |
| 5,265,611 A | 11/1993 | Hoenig et al. |
| 5,269,759 A | 12/1993 | Hernandez et al. |
| 5,271,400 A | 12/1993 | Dumoulin et al. |
| 5,273,025 A | 12/1993 | Sakiyama et al. |
| 5,274,551 A | 12/1993 | Corby, Jr. |
| 5,279,309 A | 1/1994 | Taylor et al. |
| 5,285,787 A | 2/1994 | Machida |
| 5,291,199 A | 3/1994 | Overman et al. |
| 5,291,889 A | 3/1994 | Kenet et al. |
| 5,295,483 A | 3/1994 | Nowacki et al. |
| 5,297,549 A | 3/1994 | Beatty et al. |
| 5,299,253 A | 3/1994 | Wessels |
| 5,299,254 A | 3/1994 | Dancer et al. |
| 5,299,288 A | 3/1994 | Glassman et al. |
| 5,300,080 A | 4/1994 | Clayman et al. |
| 5,301,061 A | 4/1994 | Nakada et al. |
| 5,305,091 A | 4/1994 | Gelbart et al. |
| 5,305,203 A | 4/1994 | Raab |
| 5,306,271 A | 4/1994 | Zinreich et al. |
| 5,307,072 A | 4/1994 | Jones, Jr. |
| 5,307,816 A | 5/1994 | Hashimoto et al. |
| 5,309,913 A | 5/1994 | Kormos et al. |
| 5,315,630 A | 5/1994 | Sturm et al. |
| 5,316,024 A | 5/1994 | Hirschi et al. |
| 5,318,025 A | 6/1994 | Dumoulin et al. |
| 5,320,111 A | 6/1994 | Livingston |
| 5,325,728 A | 7/1994 | Zimmerman et al. |
| 5,325,873 A | 7/1994 | Hirschi et al. |
| 5,327,889 A | 7/1994 | Imran |
| 5,329,944 A | 7/1994 | Fabian et al. |
| 5,330,485 A | 7/1994 | Clayman et al. |
| 5,333,168 A | 7/1994 | Fernandes et al. |
| 5,341,807 A | 8/1994 | Nardella |
| 5,347,289 A | 9/1994 | Elhardt |
| 5,353,795 A | 10/1994 | Souza et al. |
| 5,353,800 A | 10/1994 | Pohndorf et al. |
| 5,353,807 A | 10/1994 | DeMarco |
| 5,357,253 A | 10/1994 | Van Etten et al. |
| 5,359,417 A | 10/1994 | Muller et al. |
| 5,368,030 A | 11/1994 | Zinreich et al. |
| 5,371,778 A | 12/1994 | Yanof et al. |
| 5,375,596 A | 12/1994 | Twiss et al. |
| 5,376,795 A | 12/1994 | Hasegawa et al. |
| 5,377,678 A | 1/1995 | Dumoulin et al. |
| 5,383,454 A | 1/1995 | Bucholz |
| 5,383,852 A | 1/1995 | Stevens-Wright |
| 5,385,146 A | 1/1995 | Goldreyer |
| 5,385,148 A | 1/1995 | Lesh et al. |
| 5,386,828 A | 2/1995 | Owens et al. |
| 5,389,073 A | 2/1995 | Imran |
| 5,389,101 A | 2/1995 | Heilbrun et al. |
| 5,391,199 A | 2/1995 | Ben-Haim |
| 5,394,457 A | 2/1995 | Leibinger et al. |
| 5,394,875 A | 3/1995 | Lewis et al. |
| 5,397,321 A | 3/1995 | Houser et al. |
| 5,397,329 A | 3/1995 | Allen |
| 5,398,684 A | 3/1995 | Hardy |
| 5,398,691 A | 3/1995 | Martin et al. |
| 5,399,146 A | 3/1995 | Nowacki et al. |
| 5,400,384 A | 3/1995 | Fernandes et al. |
| 5,400,771 A | 3/1995 | Pirak et al. |
| 5,402,801 A | 4/1995 | Taylor |
| 5,405,346 A | 4/1995 | Grundy et al. |
| 5,408,409 A | 4/1995 | Glassman et al. |
| 5,409,000 A | 4/1995 | Imran |
| 5,413,573 A | 5/1995 | Koivukangas |
| 5,417,210 A | 5/1995 | Funda et al. |
| 5,419,325 A | 5/1995 | Dumoulin et al. |
| 5,423,334 A | 6/1995 | Jordan |
| 5,425,367 A | 6/1995 | Shapiro et al. |
| 5,425,382 A | 6/1995 | Golden et al. |
| 5,426,683 A | 6/1995 | O'Farrell, Jr. et al. |
| 5,426,687 A | 6/1995 | Goodall et al. |
| 5,427,097 A | 6/1995 | Depp |
| 5,429,132 A * | 7/1995 | Guy et al. ................... 600/422 |

(56) References Cited

U.S. PATENT DOCUMENTS

| | | |
|---|---|---|
| 5,433,198 A | 7/1995 | Desai |
| 5,435,573 A | 7/1995 | Oakford |
| RE35,025 E | 8/1995 | Anderton |
| 5,437,277 A | 8/1995 | Dumoulin et al. |
| 5,443,066 A | 8/1995 | Dumoulin et al. |
| 5,443,489 A | 8/1995 | Ben-Haim |
| 5,444,756 A | 8/1995 | Pai et al. |
| 5,445,144 A | 8/1995 | Wodicka et al. |
| 5,445,150 A | 8/1995 | Dumoulin et al. |
| 5,445,166 A | 8/1995 | Taylor |
| 5,446,548 A | 8/1995 | Gerig et al. |
| 5,447,154 A | 9/1995 | Cinquin et al. |
| 5,447,156 A | 9/1995 | Dumoulin et al. |
| 5,448,610 A | 9/1995 | Yamamoto et al. |
| 5,453,686 A | 9/1995 | Anderson |
| 5,456,254 A | 10/1995 | Pietroski et al. |
| 5,456,664 A | 10/1995 | Heinzelman et al. |
| 5,456,689 A | 10/1995 | Kresch et al. |
| 5,456,718 A | 10/1995 | Szymaitis |
| 5,457,641 A | 10/1995 | Zimmer et al. |
| 5,458,718 A | 10/1995 | Venkitachalam |
| 5,464,446 A | 11/1995 | Dreessen et al. |
| 5,469,847 A | 11/1995 | Zinreich et al. |
| 5,472,441 A | 12/1995 | Edwards et al. |
| 5,476,100 A | 12/1995 | Galel |
| 5,476,495 A | 12/1995 | Kordis et al. |
| 5,478,341 A | 12/1995 | Cook et al. |
| 5,478,343 A | 12/1995 | Ritter |
| 5,480,422 A | 1/1996 | Ben-Haim |
| 5,480,439 A | 1/1996 | Bisek et al. |
| 5,483,961 A | 1/1996 | Kelly et al. |
| 5,485,849 A | 1/1996 | Panescu et al. |
| 5,487,391 A | 1/1996 | Panescu |
| 5,487,729 A | 1/1996 | Avellanet et al. |
| 5,487,757 A | 1/1996 | Truckai et al. |
| 5,489,256 A | 2/1996 | Adair |
| 5,490,196 A | 2/1996 | Rudich et al. |
| 5,492,131 A | 2/1996 | Galel |
| 5,492,713 A | 2/1996 | Sommermeyer |
| 5,493,517 A | 2/1996 | Frazier |
| 5,494,034 A | 2/1996 | Schlondorff et al. |
| 5,503,416 A | 4/1996 | Aoki et al. |
| 5,513,637 A | 5/1996 | Twiss et al. |
| 5,514,146 A | 5/1996 | Lam et al. |
| 5,515,160 A | 5/1996 | Schulz et al. |
| 5,515,853 A | 5/1996 | Smith et al. |
| 5,517,990 A | 5/1996 | Kalfas et al. |
| 5,520,059 A | 5/1996 | Garshelis |
| 5,522,814 A | 6/1996 | Bernaz |
| 5,522,815 A | 6/1996 | Durgin, Jr. et al. |
| 5,531,227 A | 7/1996 | Schneider |
| 5,531,520 A | 7/1996 | Grimson et al. |
| 5,531,686 A | 7/1996 | Lundquist et al. |
| 5,542,938 A | 8/1996 | Avellanet et al. |
| 5,543,951 A | 8/1996 | Moehrmann |
| 5,545,200 A | 8/1996 | West et al. |
| 5,546,940 A | 8/1996 | Panescu et al. |
| 5,546,949 A | 8/1996 | Frazin et al. |
| 5,546,951 A | 8/1996 | Ben-Haim |
| 5,551,429 A | 9/1996 | Fitzpatrick et al. |
| 5,555,883 A | 9/1996 | Avitall |
| 5,558,091 A | 9/1996 | Acker et al. |
| 5,566,681 A | 10/1996 | Manwaring et al. |
| 5,568,384 A | 10/1996 | Robb et al. |
| 5,568,809 A | 10/1996 | Ben-haim |
| 5,571,083 A | 11/1996 | Lemelson |
| 5,572,999 A | 11/1996 | Funda et al. |
| 5,573,533 A | 11/1996 | Strul |
| 5,575,794 A | 11/1996 | Walus et al. |
| 5,575,798 A | 11/1996 | Koutrouvelis |
| 5,577,991 A | 11/1996 | Akui et al. |
| 5,583,909 A | 12/1996 | Hanover |
| 5,588,033 A | 12/1996 | Yeung |
| 5,588,430 A | 12/1996 | Bova et al. |
| 5,590,215 A | 12/1996 | Allen |
| 5,592,939 A | 1/1997 | Martinelli |
| 5,595,193 A | 1/1997 | Walus et al. |
| 5,596,228 A | 1/1997 | Anderton et al. |
| 5,599,305 A | 2/1997 | Hermann et al. |
| 5,600,330 A | 2/1997 | Blood |
| 5,603,318 A | 2/1997 | Heilbrun et al. |
| 5,606,975 A | 3/1997 | Liang et al. |
| 5,611,025 A | 3/1997 | Lorensen et al. |
| 5,617,462 A | 4/1997 | Spratt |
| 5,617,857 A | 4/1997 | Chader et al. |
| 5,619,261 A | 4/1997 | Anderton |
| 5,620,734 A | 4/1997 | Wesdorp et al. |
| 5,622,169 A | 4/1997 | Golden et al. |
| 5,622,170 A | 4/1997 | Schulz |
| 5,627,873 A | 5/1997 | Hanover et al. |
| 5,628,315 A | 5/1997 | Vilsmeier et al. |
| 5,630,431 A | 5/1997 | Taylor |
| 5,636,634 A | 6/1997 | Kordis et al. |
| 5,636,644 A | 6/1997 | Hart et al. |
| 5,638,819 A | 6/1997 | Manwaring et al. |
| 5,640,170 A | 6/1997 | Anderson |
| 5,642,395 A | 6/1997 | Anderton et al. |
| 5,643,175 A | 7/1997 | Adair |
| 5,643,268 A | 7/1997 | Vilsmeier et al. |
| 5,645,065 A | 7/1997 | Shapiro et al. |
| 5,646,524 A | 7/1997 | Gilboa |
| 5,646,525 A | 7/1997 | Gilboa |
| 5,647,361 A | 7/1997 | Damadian |
| 5,651,047 A | 7/1997 | Moorman et al. |
| 5,660,865 A | 8/1997 | Pedersen et al. |
| 5,662,108 A | 9/1997 | Budd et al. |
| 5,662,111 A | 9/1997 | Cosman |
| 5,664,001 A | 9/1997 | Tachibana et al. |
| 5,674,296 A | 10/1997 | Bryan et al. |
| 5,676,673 A | 10/1997 | Ferre et al. |
| 5,681,260 A | 10/1997 | Ueda et al. |
| 5,682,886 A | 11/1997 | Delp et al. |
| 5,682,890 A | 11/1997 | Kormos et al. |
| 5,690,108 A | 11/1997 | Chakeres |
| 5,694,945 A | 12/1997 | Ben-Haim |
| 5,695,500 A | 12/1997 | Taylor et al. |
| 5,695,501 A | 12/1997 | Carol et al. |
| 5,696,500 A | 12/1997 | Diem |
| 5,697,377 A | 12/1997 | Wittkampf |
| 5,701,898 A | 12/1997 | Adam et al. |
| 5,702,406 A | 12/1997 | Vilsmeier et al. |
| 5,711,299 A | 1/1998 | Manwaring et al. |
| 5,713,369 A | 2/1998 | Tao et al. |
| 5,713,853 A | 2/1998 | Clark et al. |
| 5,713,946 A | 2/1998 | Ben-Haim |
| 5,715,822 A | 2/1998 | Watkins |
| 5,715,836 A | 2/1998 | Kliegis et al. |
| 5,718,241 A | 2/1998 | Ben-Haim et al. |
| 5,727,552 A | 3/1998 | Ryan |
| 5,727,553 A | 3/1998 | Saad |
| 5,729,129 A * | 3/1998 | Acker ............... 324/207.12 |
| 5,730,129 A | 3/1998 | Darrow et al. |
| 5,730,130 A | 3/1998 | Fitzpatrick et al. |
| 5,732,703 A | 3/1998 | Kalfas et al. |
| 5,735,278 A | 4/1998 | Hoult et al. |
| 5,738,096 A | 4/1998 | Ben-Haim |
| 5,740,802 A | 4/1998 | Nafis et al. |
| 5,740,808 A | 4/1998 | Panescu et al. |
| 5,741,214 A | 4/1998 | Ouchi et al. |
| 5,741,320 A | 4/1998 | Thornton et al. |
| 5,742,394 A | 4/1998 | Hansen |
| 5,744,802 A | 4/1998 | Muehllehner et al. |
| 5,744,953 A | 4/1998 | Hansen |
| 5,748,767 A | 5/1998 | Raab |
| 5,749,362 A | 5/1998 | Funda et al. |
| 5,749,835 A | 5/1998 | Glantz |
| 5,752,513 A | 5/1998 | Acker et al. |
| 5,752,518 A | 5/1998 | McGee et al. |
| 5,755,725 A | 5/1998 | Druais |
| RE35,816 E | 6/1998 | Schulz |
| 5,758,667 A | 6/1998 | Slettenmark |
| 5,760,335 A | 6/1998 | Gilboa |
| 5,762,064 A | 6/1998 | Polyani |
| 5,767,669 A | 6/1998 | Hansen et al. |

(56) References Cited

U.S. PATENT DOCUMENTS

| | | |
|---|---|---|
| 5,767,699 A | 6/1998 | Bosnyak et al. |
| 5,767,960 A | 6/1998 | Orman |
| 5,769,789 A | 6/1998 | Wang et al. |
| 5,769,843 A | 6/1998 | Abela et al. |
| 5,769,861 A | 6/1998 | Vilsmeier |
| 5,772,594 A | 6/1998 | Barrick |
| 5,775,322 A | 7/1998 | Silverstein et al. |
| 5,776,050 A | 7/1998 | Chen et al. |
| 5,776,064 A | 7/1998 | Kalfas et al. |
| 5,782,765 A | 7/1998 | Jonkman |
| 5,782,828 A | 7/1998 | Chen et al. |
| 5,787,886 A | 8/1998 | Kelly et al. |
| 5,792,055 A | 8/1998 | McKinnon |
| 5,795,294 A | 8/1998 | Luber et al. |
| 5,797,849 A | 8/1998 | Vesely et al. |
| 5,799,055 A | 8/1998 | Peshkin et al. |
| 5,799,099 A | 8/1998 | Wang et al. |
| 5,800,352 A | 9/1998 | Ferre et al. |
| 5,800,535 A | 9/1998 | Howard, III |
| 5,802,719 A | 9/1998 | O'Farrell, Jr. et al. |
| 5,803,084 A | 9/1998 | Olson |
| 5,803,089 A | 9/1998 | Ferre et al. |
| 5,807,252 A | 9/1998 | Hassfeld et al. |
| 5,810,008 A | 9/1998 | Dekel et al. |
| 5,810,728 A | 9/1998 | Kuhn |
| 5,810,735 A | 9/1998 | Halperin et al. |
| 5,820,553 A | 10/1998 | Hughes |
| 5,820,591 A | 10/1998 | Thompson et al. |
| 5,823,192 A | 10/1998 | Kalend et al. |
| 5,823,958 A | 10/1998 | Truppe |
| 5,828,725 A | 10/1998 | Levinson |
| 5,828,770 A | 10/1998 | Leis et al. |
| 5,829,444 A | 11/1998 | Ferre et al. |
| 5,831,260 A | 11/1998 | Hansen |
| 5,833,608 A | 11/1998 | Acker |
| 5,834,759 A | 11/1998 | Glossop |
| 5,836,954 A | 11/1998 | Heilbrun et al. |
| 5,837,001 A | 11/1998 | Mackey |
| 5,840,024 A | 11/1998 | Taniguchi et al. |
| 5,840,025 A | 11/1998 | Ben Haim |
| 5,842,984 A | 12/1998 | Avitall |
| 5,843,051 A | 12/1998 | Adams et al. |
| 5,843,076 A | 12/1998 | Webster, Jr. et al. |
| 5,846,183 A | 12/1998 | Chilcoat |
| 5,848,967 A | 12/1998 | Cosman |
| 5,851,183 A | 12/1998 | Bucholz |
| 5,853,327 A | 12/1998 | Gilboa |
| 5,857,997 A | 1/1999 | Cimino et al. |
| 5,865,726 A | 2/1999 | Katsurada et al. |
| 5,865,846 A | 2/1999 | Bryan et al. |
| 5,868,673 A | 2/1999 | Vesely |
| 5,868,674 A | 2/1999 | Glowinski et al. |
| 5,868,675 A | 2/1999 | Henrion et al. |
| 5,871,445 A | 2/1999 | Bucholz |
| 5,871,455 A | 2/1999 | Ueno |
| 5,871,487 A | 2/1999 | Warner et al. |
| 5,871,523 A | 2/1999 | Fleischman et al. |
| 5,873,822 A | 2/1999 | Ferre et al. |
| 5,882,304 A | 3/1999 | Ehnholm et al. |
| 5,884,410 A | 3/1999 | Prinz |
| 5,889,834 A | 3/1999 | Vilsmeier et al. |
| 5,891,034 A | 4/1999 | Bucholz |
| 5,891,134 A | 4/1999 | Goble et al. |
| 5,891,157 A | 4/1999 | Day et al. |
| 5,893,885 A | 4/1999 | Webster, Jr. |
| 5,899,860 A | 5/1999 | Pfeiffer et al. |
| 5,902,239 A | 5/1999 | Buurman |
| 5,902,324 A | 5/1999 | Thompson et al. |
| 5,904,691 A | 5/1999 | Barnett et al. |
| 5,907,395 A | 5/1999 | Schulz et al. |
| 5,909,476 A | 6/1999 | Cheng et al. |
| 5,913,820 A | 6/1999 | Bladen et al. |
| 5,916,210 A | 6/1999 | Winston |
| 5,919,147 A | 7/1999 | Jain |
| 5,919,188 A | 7/1999 | Shearon et al. |
| 5,920,395 A | 7/1999 | Schulz |
| 5,921,992 A | 7/1999 | Costales et al. |
| 5,923,727 A | 7/1999 | Navab |
| 5,928,248 A | 7/1999 | Acker |
| 5,930,329 A | 7/1999 | Navab |
| 5,935,160 A | 8/1999 | Auricchio et al. |
| 5,938,585 A | 8/1999 | Donofrio |
| 5,938,602 A | 8/1999 | Lloyd |
| 5,938,603 A | 8/1999 | Ponzi |
| 5,938,694 A | 8/1999 | Jaraczewski et al. |
| 5,941,251 A | 8/1999 | Panescu et al. |
| 5,944,023 A | 8/1999 | Johnson et al. |
| 5,947,925 A | 9/1999 | Ashiya et al. |
| 5,947,980 A | 9/1999 | Jensen et al. |
| 5,947,981 A | 9/1999 | Cosman |
| 5,950,629 A | 9/1999 | Taylor et al. |
| 5,951,461 A | 9/1999 | Nyo et al. |
| 5,951,475 A | 9/1999 | Gueziec et al. |
| 5,951,571 A | 9/1999 | Audette |
| 5,954,647 A | 9/1999 | Bova et al. |
| 5,954,649 A | 9/1999 | Chia et al. |
| 5,954,796 A | 9/1999 | McCarty et al. |
| 5,957,844 A | 9/1999 | Dekel et al. |
| 5,966,090 A | 10/1999 | McEwan |
| 5,967,980 A | 10/1999 | Ferre et al. |
| 5,967,982 A | 10/1999 | Barnett |
| 5,968,047 A | 10/1999 | Reed |
| 5,971,997 A | 10/1999 | Guthrie et al. |
| 5,976,127 A | 11/1999 | Lax |
| 5,976,156 A | 11/1999 | Taylor et al. |
| 5,980,504 A | 11/1999 | Sharkey et al. |
| 5,980,535 A | 11/1999 | Barnett et al. |
| 5,983,126 A | 11/1999 | Wittkampf |
| 5,987,349 A | 11/1999 | Schulz |
| 5,987,960 A | 11/1999 | Messner et al. |
| 5,999,837 A | 12/1999 | Messner et al. |
| 5,999,840 A | 12/1999 | Grimson et al. |
| 6,001,130 A | 12/1999 | Bryan et al. |
| 6,004,269 A | 12/1999 | Crowley et al. |
| 6,006,126 A | 12/1999 | Cosman |
| 6,006,127 A | 12/1999 | Van Der Brug et al. |
| 6,013,087 A | 1/2000 | Adams et al. |
| 6,014,580 A | 1/2000 | Blume et al. |
| 6,016,439 A | 1/2000 | Acker |
| 6,019,724 A | 2/2000 | Gronningsaeter et al. |
| 6,019,725 A | 2/2000 | Vesely et al. |
| 6,019,728 A | 2/2000 | Iwata et al. |
| 6,022,578 A | 2/2000 | Miller |
| 6,024,695 A | 2/2000 | Taylor et al. |
| 6,024,739 A | 2/2000 | Ponzi et al. |
| 6,032,675 A | 3/2000 | Rubinsky |
| 6,035,229 A | 3/2000 | Silverstein et al. |
| 6,050,724 A | 4/2000 | Schmitz et al. |
| 6,059,718 A | 5/2000 | Taniguchi et al. |
| 6,061,588 A | 5/2000 | Thornton et al. |
| 6,063,022 A | 5/2000 | Ben-Haim |
| 6,064,390 A | 5/2000 | Sagar et al. |
| 6,071,288 A | 6/2000 | Carol et al. |
| 6,073,043 A | 6/2000 | Schneider |
| 6,076,008 A | 6/2000 | Bucholz |
| 6,077,257 A | 6/2000 | Edwards et al. |
| 6,096,036 A | 8/2000 | Bowe et al. |
| 6,096,050 A | 8/2000 | Audette |
| 6,104,294 A | 8/2000 | Andersson et al. |
| 6,104,944 A | 8/2000 | Martinelli |
| 6,106,517 A | 8/2000 | Zupkas |
| 6,112,111 A | 8/2000 | Glantz |
| 6,115,626 A | 9/2000 | Whayne et al. |
| 6,117,476 A | 9/2000 | Eger et al. |
| 6,118,845 A | 9/2000 | Simon et al. |
| 6,122,538 A | 9/2000 | Sliwa, Jr. et al. |
| 6,122,541 A | 9/2000 | Cosman et al. |
| 6,123,979 A | 9/2000 | Hepburn et al. |
| 6,131,396 A | 10/2000 | Duerr et al. |
| 6,139,183 A | 10/2000 | Graumann |
| 6,147,480 A | 11/2000 | Osadchy et al. |
| 6,149,592 A | 11/2000 | Yanof et al. |
| 6,156,067 A | 12/2000 | Bryan et al. |
| 6,161,032 A | 12/2000 | Acker |

(56) References Cited

U.S. PATENT DOCUMENTS

| | | | |
|---|---|---|---|
| 6,165,181 A | 12/2000 | Heilbrun et al. | |
| 6,167,296 A | 12/2000 | Shahidi | |
| 6,171,303 B1 | 1/2001 | Ben-Haim et al. | |
| 6,172,499 B1 | 1/2001 | Ashe | |
| 6,175,756 B1 | 1/2001 | Ferre et al. | |
| 6,178,345 B1 | 1/2001 | Vilsmeier et al. | |
| 6,179,809 B1 | 1/2001 | Khairkhahan et al. | |
| 6,183,444 B1 | 2/2001 | Glines et al. | |
| 6,188,355 B1 | 2/2001 | Gilboa | |
| 6,192,280 B1 | 2/2001 | Sommer et al. | |
| 6,194,639 B1 | 2/2001 | Botella et al. | |
| 6,201,387 B1 | 3/2001 | Govari | |
| 6,203,493 B1 | 3/2001 | Ben-Haim | |
| 6,203,497 B1 | 3/2001 | Dekel et al. | |
| 6,208,884 B1 | 3/2001 | Kumar et al. | |
| 6,210,362 B1 | 4/2001 | Ponzi | |
| 6,211,666 B1 | 4/2001 | Acker | |
| 6,213,995 B1 | 4/2001 | Steen et al. | |
| 6,213,998 B1 | 4/2001 | Shen et al. | |
| 6,216,027 B1 | 4/2001 | Willis et al. | |
| 6,216,029 B1 | 4/2001 | Paltieli | |
| 6,223,067 B1 | 4/2001 | Vilsmeier | |
| 6,226,543 B1 | 5/2001 | Gilboa et al. | |
| 6,233,476 B1 | 5/2001 | Strommer et al. | |
| 6,236,875 B1 | 5/2001 | Bucholz et al. | |
| 6,245,020 B1 | 6/2001 | Moore et al. | |
| 6,246,231 B1 | 6/2001 | Ashe | |
| 6,246,784 B1 | 6/2001 | Summers et al. | |
| 6,246,898 B1 | 6/2001 | Vesely et al. | |
| 6,246,899 B1 | 6/2001 | Chia et al. | |
| 6,248,074 B1 | 6/2001 | Ohno et al. | |
| 6,253,770 B1 | 7/2001 | Acker et al. | |
| 6,259,942 B1 | 7/2001 | Westermann et al. | |
| 6,264,654 B1 | 7/2001 | Swartz et al. | |
| 6,272,371 B1 | 8/2001 | Shlomo | |
| 6,273,896 B1 | 8/2001 | Franck et al. | |
| 6,285,902 B1 | 9/2001 | Kienzle, III et al. | |
| 6,298,262 B1 | 10/2001 | Franck et al. | |
| 6,304,769 B1 | 10/2001 | Arenson et al. | |
| 6,306,097 B1 | 10/2001 | Park et al. | |
| 6,314,310 B1 | 11/2001 | Ben-Haim et al. | |
| 6,319,250 B1 | 11/2001 | Falwell et al. | |
| 6,331,116 B1 | 12/2001 | Kaufman et al. | |
| 6,331,156 B1 | 12/2001 | Haefele et al. | |
| 6,332,089 B1 | 12/2001 | Acker et al. | |
| 6,335,617 B1 | 1/2002 | Osadchy et al. | |
| 6,341,231 B1 | 1/2002 | Ferre et al. | |
| 6,345,112 B1 | 2/2002 | Summers et al. | |
| 6,346,940 B1 | 2/2002 | Fukunaga | |
| 6,351,513 B1 | 2/2002 | Bani-Hashemi et al. | |
| 6,351,659 B1 | 2/2002 | Vilsmeier | |
| 6,366,799 B1 | 4/2002 | Acker et al. | |
| 6,373,240 B1 * | 4/2002 | Govari | 324/207.17 |
| 6,380,732 B1 | 4/2002 | Gilboa | |
| 6,381,485 B1 | 4/2002 | Hunter et al. | |
| 6,383,144 B1 | 5/2002 | Mooney et al. | |
| 6,405,072 B1 | 6/2002 | Cosman | |
| 6,423,009 B1 | 7/2002 | Downey et al. | |
| 6,424,856 B1 | 7/2002 | Vilsmeier et al. | |
| 6,427,314 B1 | 8/2002 | Acker | |
| 6,428,547 B1 | 8/2002 | Vilsmeier et al. | |
| 6,434,415 B1 | 8/2002 | Foley et al. | |
| 6,437,567 B1 | 8/2002 | Schenck et al. | |
| 6,443,894 B1 | 9/2002 | Sumanaweera et al. | |
| 6,445,943 B1 | 9/2002 | Ferre et al. | |
| 6,447,504 B1 | 9/2002 | Ben-Haim et al. | |
| 6,453,190 B1 | 9/2002 | Acker et al. | |
| 6,468,265 B1 | 10/2002 | Evans et al. | |
| 6,470,207 B1 | 10/2002 | Simon et al. | |
| 6,473,635 B1 | 10/2002 | Rasche | |
| 6,474,341 B1 | 11/2002 | Hunter et al. | |
| 6,478,802 B2 | 11/2002 | Kienzle, III et al. | |
| 6,484,049 B1 | 11/2002 | Seeley et al. | |
| 6,484,118 B1 | 11/2002 | Govari | |
| 6,490,475 B1 | 12/2002 | Seeley et al. | |
| 6,493,573 B1 | 12/2002 | Martinelli et al. | |
| 6,498,477 B1 * | 12/2002 | Govari et al. | 324/207.12 |
| 6,498,944 B1 | 12/2002 | Ben-Haim et al. | |
| 6,499,488 B1 | 12/2002 | Hunter et al. | |
| 6,516,046 B1 | 2/2003 | Frohlich et al. | |
| 6,517,534 B1 | 2/2003 | McGovern et al. | |
| 6,527,443 B1 | 3/2003 | Vilsmeier et al. | |
| 6,551,325 B2 | 4/2003 | Neubauer et al. | |
| 6,558,333 B2 | 5/2003 | Gilboa et al. | |
| 6,574,492 B1 | 6/2003 | Ben-Haim et al. | |
| 6,574,498 B1 | 6/2003 | Gilboa | |
| 6,580,938 B1 | 6/2003 | Acker | |
| 6,584,174 B2 | 6/2003 | Schubert et al. | |
| 6,585,763 B1 | 7/2003 | Keilman et al. | |
| 6,591,129 B1 | 7/2003 | Ben-Haim et al. | |
| 6,593,884 B1 | 7/2003 | Gilboa et al. | |
| 6,609,022 B2 | 8/2003 | Vilsmeier et al. | |
| 6,611,700 B1 | 8/2003 | Vilsmeier et al. | |
| 6,615,155 B2 | 9/2003 | Gilboa | |
| 6,618,612 B1 | 9/2003 | Acker et al. | |
| 6,628,980 B2 | 9/2003 | Atalar | |
| 6,640,128 B2 | 10/2003 | Vilsmeier et al. | |
| 6,650,927 B1 | 11/2003 | Keidar | |
| 6,666,864 B2 | 12/2003 | Bencini et al. | |
| 6,676,659 B2 | 1/2004 | Hutchins et al. | |
| 6,690,816 B2 | 2/2004 | Aylward et al. | |
| 6,690,963 B2 | 2/2004 | Ben-Haim et al. | |
| 6,694,162 B2 | 2/2004 | Hartlep | |
| 6,701,179 B1 | 3/2004 | Martinelli et al. | |
| 6,702,780 B1 | 3/2004 | Gilboa et al. | |
| 6,706,041 B1 | 3/2004 | Costantino | |
| 6,711,429 B1 | 3/2004 | Gilboa et al. | |
| 6,735,465 B2 | 5/2004 | Panescu | |
| 6,751,492 B2 | 6/2004 | Ben-Haim | |
| 6,770,070 B1 | 8/2004 | Balbierz | |
| 6,788,967 B2 | 9/2004 | Ben-Haim et al. | |
| 6,796,963 B2 | 9/2004 | Carpenter et al. | |
| 6,810,281 B2 | 10/2004 | Brock et al. | |
| 6,833,814 B2 | 12/2004 | Gilboa et al. | |
| 6,887,236 B2 | 5/2005 | Gilboa | |
| 6,947,788 B2 | 9/2005 | Gilboa et al. | |
| 6,976,013 B1 | 12/2005 | Mah | |
| 6,995,729 B2 | 2/2006 | Govari et al. | |
| 6,996,430 B1 | 2/2006 | Gilboa et al. | |
| 7,033,325 B1 | 4/2006 | Sullivan | |
| 7,176,936 B2 | 2/2007 | Sauer et al. | |
| 7,197,354 B2 | 3/2007 | Sobe | |
| 7,233,820 B2 | 6/2007 | Gilboa | |
| 7,236,567 B2 | 6/2007 | Sandkamp et al. | |
| 7,286,868 B2 | 10/2007 | Govari | |
| 7,301,332 B2 | 11/2007 | Govari et al. | |
| 7,321,228 B2 * | 1/2008 | Govari | 324/207.17 |
| 7,324,915 B2 | 1/2008 | Altmann et al. | |
| 7,343,195 B2 | 3/2008 | Strommer et al. | |
| 7,353,125 B2 | 4/2008 | Nieminen et al. | |
| 7,357,795 B2 | 4/2008 | Kaji et al. | |
| 7,366,562 B2 | 4/2008 | Dukesherer et al. | |
| 7,370,656 B2 | 5/2008 | Gleich et al. | |
| 7,373,271 B1 | 5/2008 | Schneider | |
| 7,386,339 B2 | 6/2008 | Strommer et al. | |
| 7,397,364 B2 | 7/2008 | Govari | |
| 7,399,296 B2 | 7/2008 | Poole et al. | |
| 7,420,468 B2 * | 9/2008 | Fabian et al. | 340/572.1 |
| 7,497,029 B2 | 3/2009 | Plassky et al. | |
| 7,505,809 B2 | 3/2009 | Strommer et al. | |
| 7,517,318 B2 | 4/2009 | Altmann et al. | |
| 7,536,218 B2 | 5/2009 | Govari et al. | |
| 7,555,330 B2 | 6/2009 | Gilboa et al. | |
| RE40,852 E | 7/2009 | Martinelli et al. | |
| 7,570,987 B2 | 8/2009 | Raabe et al. | |
| 7,577,474 B2 | 8/2009 | Vilsmeier | |
| 7,579,837 B2 | 8/2009 | Fath et al. | |
| 7,587,235 B2 | 9/2009 | Wist et al. | |
| 7,599,535 B2 | 10/2009 | Kiraly et al. | |
| 7,599,810 B2 | 10/2009 | Yamazaki | |
| 7,630,753 B2 | 12/2009 | Simon et al. | |
| 7,634,122 B2 | 12/2009 | Bertram et al. | |
| 7,636,595 B2 | 12/2009 | Marquart et al. | |
| 7,641,609 B2 | 1/2010 | Ohnishi et al. | |

(56) References Cited

U.S. PATENT DOCUMENTS

| | | | |
|---|---|---|---|
| 7,648,458 B2 | 1/2010 | Niwa et al. |
| 7,652,468 B2 | 1/2010 | Kruger et al. |
| 7,652,578 B2 * | 1/2010 | Braun et al. ............... 340/572.4 |
| 7,657,300 B2 | 2/2010 | Hunter et al. |
| 7,659,912 B2 | 2/2010 | Akimoto et al. |
| 7,660,623 B2 | 2/2010 | Hunter et al. |
| 7,680,528 B2 | 3/2010 | Pfister et al. |
| 7,684,849 B2 | 3/2010 | Wright et al. |
| 7,686,767 B2 | 3/2010 | Maschke |
| 7,688,064 B2 | 3/2010 | Shalgi et al. |
| 7,696,899 B2 | 4/2010 | Immerz et al. |
| 7,697,972 B2 | 4/2010 | Verard et al. |
| 7,697,973 B2 | 4/2010 | Strommer et al. |
| 7,697,974 B2 | 4/2010 | Jenkins et al. |
| 7,720,517 B2 | 5/2010 | Drysen |
| 7,722,565 B2 | 5/2010 | Wood et al. |
| 7,725,154 B2 | 5/2010 | Beck et al. |
| 7,725,164 B2 | 5/2010 | Suurmond et al. |
| 7,727,269 B2 | 6/2010 | Abraham-Fuchs et al. |
| 7,729,742 B2 | 6/2010 | Govari |
| 7,744,605 B2 | 6/2010 | Vilsmeier et al. |
| 7,747,307 B2 | 6/2010 | Wright et al. |
| 7,751,865 B2 | 7/2010 | Jascob et al. |
| 7,782,189 B2 * | 8/2010 | Spoonhower et al. ... 340/539.12 |
| 7,784,468 B2 * | 8/2010 | Fabian et al. ............... 128/899 |
| 7,831,076 B2 | 11/2010 | Altmann et al. |
| 7,905,827 B2 * | 3/2011 | Uchiyama et al. ........... 600/103 |
| 7,912,662 B2 * | 3/2011 | Zuhars et al. ............... 702/85 |
| 7,969,143 B2 | 6/2011 | Gilboa |
| 2001/0007918 A1 | 7/2001 | Vilsmeier et al. |
| 2001/0031919 A1 | 10/2001 | Strommer et al. |
| 2001/0034530 A1 | 10/2001 | Malackowsli et al. |
| 2001/0036245 A1 | 11/2001 | Kienzle, III et al. |
| 2001/0038705 A1 | 11/2001 | Rubbert et al. |
| 2002/0022837 A1 | 2/2002 | Mazzocchi et al. |
| 2002/0045916 A1 | 4/2002 | Gray et al. |
| 2002/0045919 A1 | 4/2002 | Johansson-Ruden et al. |
| 2002/0065461 A1 | 5/2002 | Cosman |
| 2002/0082498 A1 | 6/2002 | Wendt et al. |
| 2002/0095081 A1 | 7/2002 | Vilsmeier |
| 2002/0128565 A1 | 9/2002 | Rudy |
| 2002/0137014 A1 | 9/2002 | Anderson et al. |
| 2002/0143324 A1 | 10/2002 | Edwards |
| 2002/0165448 A1 | 11/2002 | Ben-Haim et al. |
| 2002/0173689 A1 | 11/2002 | Kaplan |
| 2002/0193686 A1 | 12/2002 | Gilboa |
| 2003/0018251 A1 | 1/2003 | Solomon |
| 2003/0074011 A1 | 4/2003 | Gilboa et al. |
| 2003/0086599 A1 | 5/2003 | Armato, III et al. |
| 2003/0099390 A1 | 5/2003 | Zeng et al. |
| 2003/0142753 A1 | 7/2003 | Gunday |
| 2003/0144658 A1 | 7/2003 | Schwartz et al. |
| 2003/0160721 A1 | 8/2003 | Gilboa et al. |
| 2003/0216639 A1 | 11/2003 | Gilboa et al. |
| 2004/0006268 A1 | 1/2004 | Gilboa et al. |
| 2004/0015049 A1 | 1/2004 | Zaar |
| 2004/0019350 A1 | 1/2004 | O'Brien et al. |
| 2004/0024309 A1 | 2/2004 | Ferre et al. |
| 2004/0086161 A1 | 5/2004 | Sivaramakrishna et al. |
| 2004/0097804 A1 | 5/2004 | Sobe |
| 2004/0122310 A1 | 6/2004 | Lim |
| 2004/0138548 A1 | 7/2004 | Strommer et al. |
| 2004/0143317 A1 | 7/2004 | Stinson et al. |
| 2004/0169509 A1 | 9/2004 | Czipott et al. |
| 2004/0215181 A1 | 10/2004 | Christopherson et al. |
| 2004/0249267 A1 | 12/2004 | Gilboa |
| 2004/0254454 A1 | 12/2004 | Kockro |
| 2005/0018885 A1 | 1/2005 | Chen et al. |
| 2005/0027193 A1 | 2/2005 | Mitschke et al. |
| 2005/0033149 A1 | 2/2005 | Strommer et al. |
| 2005/0059890 A1 | 3/2005 | Deal et al. |
| 2005/0085715 A1 | 4/2005 | Dukesher et al. |
| 2005/0090818 A1 | 4/2005 | Pike, Jr. et al. |
| 2005/0107688 A1 | 5/2005 | Strommer |
| 2005/0119527 A1 | 6/2005 | Banik et al. |
| 2005/0182295 A1 | 8/2005 | Soper et al. |
| 2005/0197566 A1 | 9/2005 | Strommer et al. |
| 2005/0272971 A1 | 12/2005 | Ohnishi et al. |
| 2006/0015126 A1 | 1/2006 | Sher |
| 2006/0058647 A1 | 3/2006 | Strommer et al. |
| 2006/0064006 A1 | 3/2006 | Strommer et al. |
| 2006/0079759 A1 | 4/2006 | Vaillant et al. |
| 2006/0116575 A1 | 6/2006 | Willis |
| 2006/0149134 A1 | 7/2006 | Soper et al. |
| 2006/0181271 A1 * | 8/2006 | Lescourret ............... 324/207.17 |
| 2006/0208725 A1 * | 9/2006 | Tapson ...................... 324/207.17 |
| 2006/0241396 A1 * | 10/2006 | Fabian et al. .................. 600/424 |
| 2006/0241399 A1 * | 10/2006 | Fabian .......................... 600/424 |
| 2007/0163597 A1 | 7/2007 | Mikkaichi et al. |
| 2007/0167714 A1 | 7/2007 | Kiraly et al. |
| 2007/0167738 A1 | 7/2007 | Timinger et al. |
| 2007/0167743 A1 | 7/2007 | Honda et al. |
| 2007/0167804 A1 | 7/2007 | Park et al. |
| 2007/0167806 A1 | 7/2007 | Wood et al. |
| 2007/0225553 A1 | 9/2007 | Shahidi |
| 2007/0232898 A1 | 10/2007 | Huynh et al. |
| 2007/0265639 A1 | 11/2007 | Danek et al. |
| 2007/0287901 A1 | 12/2007 | Strommer et al. |
| 2008/0008368 A1 | 1/2008 | Matsumoto |
| 2008/0018468 A1 * | 1/2008 | Volpi et al. ................. 340/572.1 |
| 2008/0033452 A1 | 2/2008 | Vetter et al. |
| 2008/0086051 A1 | 4/2008 | Voegele |
| 2008/0097154 A1 | 4/2008 | Makower et al. |
| 2008/0097187 A1 | 4/2008 | Gielen et al. |
| 2008/0118135 A1 | 5/2008 | Averbuch et al. |
| 2008/0132909 A1 | 6/2008 | Jascob et al. |
| 2008/0132911 A1 | 6/2008 | Sobe |
| 2008/0139886 A1 | 6/2008 | Tatsuyama |
| 2008/0139915 A1 | 6/2008 | Dolan et al. |
| 2008/0144909 A1 | 6/2008 | Wiemker et al. |
| 2008/0147000 A1 | 6/2008 | Seibel et al. |
| 2008/0154172 A1 | 6/2008 | Mauch |
| 2008/0157755 A1 | 7/2008 | Kruger et al. |
| 2008/0161682 A1 | 7/2008 | Kendrick et al. |
| 2008/0162074 A1 | 7/2008 | Schneider |
| 2008/0183071 A1 | 7/2008 | Strommer et al. |
| 2008/0188749 A1 | 8/2008 | Rasche et al. |
| 2008/0247622 A1 | 10/2008 | Aylward et al. |
| 2009/0082665 A1 * | 3/2009 | Anderson ...................... 600/424 |
| 2009/0182224 A1 | 7/2009 | Shmarak et al. |
| 2009/0189820 A1 * | 7/2009 | Saito et al. ..................... 343/757 |
| 2009/0318797 A1 | 12/2009 | Hadani |
| 2011/0085720 A1 | 4/2011 | Averbuch |

FOREIGN PATENT DOCUMENTS

| | | |
|---|---|---|
| DE | 3520782 | 12/1986 |
| DE | 3717871 | 12/1988 |
| DE | 3838011 | 7/1989 |
| DE | 4213426 | 10/1992 |
| DE | 4225112 | 12/1993 |
| DE | 4233978 | 4/1994 |
| DE | 19715202 | 10/1998 |
| DE | 19751761 | 10/1998 |
| DE | 19832296 | 2/1999 |
| DE | 19747427 | 5/1999 |
| DE | 10085137 | 11/2002 |
| EP | 0 062 941 A1 | 10/1982 |
| EP | 0 119 660 A1 | 9/1984 |
| EP | 0 155 857 A2 | 9/1985 |
| EP | 0 319 844 A1 | 6/1989 |
| EP | 0 326 768 A2 | 8/1989 |
| EP | 0 350 996 A1 | 1/1990 |
| EP | 0 427 358 A1 | 5/1991 |
| EP | 0 456 103 A2 | 11/1991 |
| EP | 0 600 610 A2 | 6/1993 |
| EP | 0581704 | 2/1994 |
| EP | 0 894 473 A2 | 8/1994 |
| EP | 0 796 633 A1 | 9/1997 |
| EP | 0 908 146 A2 | 10/1997 |
| EP | 0 930 046 A2 | 11/1997 |
| EP | 0 829 229 A1 | 3/1998 |
| EP | 0 655 138 B1 | 4/1998 |
| EP | 0 894 473 A2 | 2/1999 |

(56) References Cited

FOREIGN PATENT DOCUMENTS

| | | |
|---|---|---|
| EP | 0 922 966 A2 | 6/1999 |
| EP | 1 078 644 A1 | 8/1999 |
| EP | 2 096 523 A1 | 9/2009 |
| FR | 2618211 | 1/1989 |
| GB | 2 094 590 A | 9/1982 |
| GB | 2 164 856 A | 4/1986 |
| GB | 2 197 078 A | 5/1988 |
| JP | 3025752 B | 4/1991 |
| JP | 03 267054 A | 11/1991 |
| JP | 06 194639 A | 7/1994 |
| JP | 0 651 968 A1 | 5/1995 |
| JP | 07-159378 A | 6/1995 |
| JP | 08-233601 A | 9/1996 |
| JP | 08-299305 A | 11/1996 |
| WO | WO 88/09151 A1 | 12/1988 |
| WO | WO 89/05123 A1 | 6/1989 |
| WO | WO 90/05494 A1 | 5/1990 |
| WO | WO 91/03982 A1 | 4/1991 |
| WO | WO 91/04711 A1 | 4/1991 |
| WO | WO 91/07726 A1 | 5/1991 |
| WO | WO 92/03090 A1 | 3/1992 |
| WO | WO 92/06645 A1 | 4/1992 |
| WO | WO 94/04938 A1 | 3/1994 |
| WO | WO 94/23647 A1 | 10/1994 |
| WO | WO 94/24933 A1 | 11/1994 |
| WO | WO 95/07055 A1 | 3/1995 |
| WO | WO 95/09562 A1 | 4/1995 |
| WO | WO 96/05768 A1 | 2/1996 |
| WO | WO 96/11624 A1 | 4/1996 |
| WO | WO 96/32059 A1 | 10/1996 |
| WO | WO 96/41119 A1 | 12/1996 |
| WO | WO 97/00011 A1 | 1/1997 |
| WO | WO 97/00054 A1 | 1/1997 |
| WO | WO 97/00058 A1 | 1/1997 |
| WO | WO 97/00059 A1 | 1/1997 |
| WO | WO 97/00308 A1 | 1/1997 |
| WO | WO 97/02650 A1 | 1/1997 |
| WO | WO 97/25101 A2 | 7/1997 |
| WO | WO 97/29682 A1 | 8/1997 |
| WO | WO 97/29684 A1 | 8/1997 |
| WO | WO 97/29685 A1 | 8/1997 |
| WO | WO 97/29701 A1 | 8/1997 |
| WO | WO 97/29709 A1 | 8/1997 |
| WO | WO 97/36143 A1 | 10/1997 |
| WO | WO 97/36192 A1 | 10/1997 |
| WO | WO 97/42517 A1 | 11/1997 |
| WO | WO 97/44089 A1 | 11/1997 |
| WO | WO 97/49453 A1 | 12/1997 |
| WO | WO 98/00034 A2 | 1/1998 |
| WO | WO 98/08554 A1 | 3/1998 |
| WO | WO 98/11840 A1 | 3/1998 |
| WO | WO 98/29032 A1 | 7/1998 |
| WO | WO 98/35720 A2 | 8/1998 |
| WO | WO 98/38908 A1 | 9/1998 |
| WO | WO 98/48722 A1 | 11/1998 |
| WO | WO 99/15097 A1 | 4/1999 |
| WO | WO 99/16350 A1 | 4/1999 |
| WO | WO 99/21498 A1 | 5/1999 |
| WO | WO 99/23956 A1 | 5/1999 |
| WO | WO 99/26549 A1 | 6/1999 |
| WO | WO 99/26826 A2 | 6/1999 |
| WO | WO 99/27839 A1 | 6/1999 |
| WO | WO 99/29253 A1 | 6/1999 |
| WO | WO 99/30777 A1 | 6/1999 |
| WO | WO 99/32033 A1 | 7/1999 |
| WO | WO 99/33406 A1 | 7/1999 |
| WO | WO 99/37208 A1 | 7/1999 |
| WO | WO 99/38449 A1 | 8/1999 |
| WO | WO 99/52094 A1 | 10/1999 |
| WO | WO 99/55415 A1 | 11/1999 |
| WO | WO 99/60939 A1 | 12/1999 |
| WO | WO 00/06701 A1 | 2/2000 |
| WO | WO 00/10456 A1 | 3/2000 |
| WO | WO 00/16684 A1 | 3/2000 |
| WO | WO 00/35531 A1 | 6/2000 |
| WO | WO 01/06917 A1 | 2/2001 |
| WO | WO 01/12057 A1 | 2/2001 |
| WO | WO 01/30437 A1 | 5/2001 |
| WO | WO 01/67035 A1 | 9/2001 |
| WO | WO 01/87136 A2 | 11/2001 |
| WO | WO 01/91842 A1 | 12/2001 |
| WO | WO 02/064011 A2 | 8/2002 |
| WO | WO 02/070047 A1 | 9/2002 |
| WO | WO 03/086498 A2 | 10/2003 |
| WO | WO 2004/023986 A1 | 3/2004 |
| WO | WO 2006/116597 A2 | 11/2006 |

OTHER PUBLICATIONS

Ost et al., "Evaluation and Management of the Solitary Pulmonary Nodule," *Am J Respir Crit Care Med* vol. 162, pp. 782-787, Sep. 2000, 5 pages.

Breyer, B. et al., "Ultrasonically marked catheter—a method for positive echographic catheter position identification," *Medical & Biological Engineering & Computing*, May 1984, 22(3)268-271, 4 pages.

Ramm, G. et al., *The Radon Transform and Local Tomography*, CRC Press, 1996, 10 pages.

Natterer, F., *The Mathematics of Computerized Tomography*, Wiley, 1989, 4 pages.

PCT International Preliminary Report on Patentability corresponding to PCT/IB2009/005167, issued Oct. 5, 2010; 5 pp.

International Search Report corresponding to PCT/IB2009/005167, mailed Sep. 25, 2009; 1 p.

Written Opinion corresponding to PCT/IB2009/005167, mailed Sep. 25, 2009; 4 pp.

Herman, G.T. et al., *Discrete Tomography: Foundations Algorithms and Applications*, Birkhäuser, 1999; 3 pp.

Herman, G.T. et al., *Tomography and Inverse Problems*, Hilger, 1987; 5 pp.

\* cited by examiner

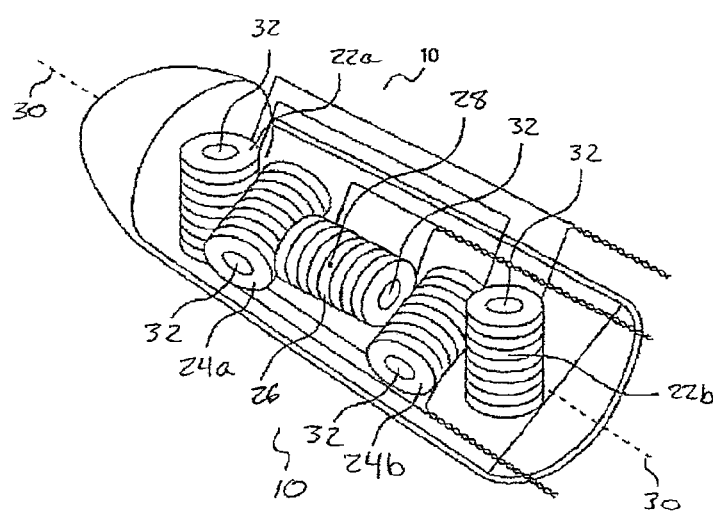
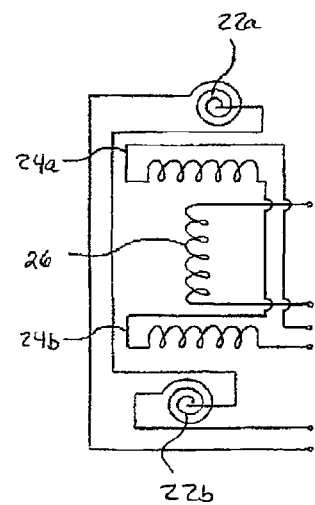
FIG. 5A                    FIG. 5B

MAGNETIC INTERFERENCE DETECTION SYSTEM AND METHOD

RELATED APPLICATIONS

The present application is related to and claims priority from provisional patent application Ser. No. 61/042,191, entitled "Magnetic Interference Detection System and Method" filed Apr. 3, 2008, the entirety of which is incorporated by reference herein; and is also related to and also claims priority from provisional patent application Ser. No. 61/042,578, entitled "Magnetic Interference Detection System and Method" filed Apr. 4, 2008, the entirety of which is incorporated by reference herein.

BACKGROUND OF THE INVENTION

Identifying and treating lung tissue abnormalities presents challenges that are somewhat unique to the lungs. If a tissue lesion or tumor is to be identified and excised surgically, the chest wall must be opened to provide access to the lungs. Opening the chest wall is a common procedure but one that presents risks of infection and lengthy recovery time, nonetheless.

A desirable alternative to surgery, in terms of reducing patient trauma, is to identify and excise the tumor endoscopically. Endoscopic surgery in the lungs, however, means that the complicated bronchial maze must be navigated. In order to assist in navigating the lungs, systems, such as that described in U.S. Pat. No. 7,233,820 to Gilboa, have been developed that include a sensor at the end of an endoscope.

The sensor is able to detect a plurality of magnetic fields generated by a location board, a flat mat on which the patient lies during the procedure. The magnetic fields collectively create an operable space known as a sensing volume. Each of the fields is oriented differently, such that three-dimensional coordinates of a sensor in the sensing volume can be determined and displayed. In order to overcome static interference such as the operating bed conducting parts, a mapping phase is performed when the system is installed. This mapping phase measures the actual shape of the magnetic field and generates correction or compensation parameters that enable the system to calculate the location of the sensor accurately taking into account the distorted magnetic field due to the static conducting parts.

Understandably, in order to provide useful, accurate data from within a body cavity, the sensor or sensors at the tip of the endoscope are very sensitive. Hence, if the magnetic field in the sensing volume is altered at all from the original field that was mapped during installation, such as by introduction of additional conducting objects into the sensing volume or changes to the previously mapped bed configuration the sensor will give data that is correspondingly altered. The result will be a sensor location indication that does not reflect the true location of the sensor. To the physician performing the procedure, it may not be evident that the magnetic field is being interfered with or that the sensor location indication is inaccurate.

It is evident that there is a need for a system and method of alerting a physician or other user of an endoscopic navigation system, such as that described above, that the magnetic field or data received has been compromised.

SUMMARY OF THE INVENTION

The system and method of the present invention detects magnetic interference within a location field of an endoscopic navigation system. An alert is generated warning the user of the system that the magnetic field has been distorted and that the location data being generated by the sensor may be unreliable.

The location board of an endoscopic navigation of the type addressed by the present invention has three coils. Each of the coils is shaped differently to provide location information along a separate axis. In order to prevent interference among the coils, each field is transmitted on a different frequency. Though each coil is supplied with electricity in order to generate a magnetic field, each coil necessarily has the capability of creating an electrical signal if subjected to a dynamic electrical field through the property of inductance.

The present invention uses a variety of techniques to use the location system in a way similar to a metal detector to monitor changes in the "magnetic environment". If a metal, or other ferrous object, is introduced into the sensing volume and somehow influences the magnetic field, the location system detects that the magnetic field has been altered or compromised and creates a warning condition that alerts the user that the information being provided may be unreliable.

One technique used by the present invention is to monitor the self-inductance and mutual-inductance changes in the coils of the location board. Self-inductance of a coil will change when the ferromagnetic material in the coil's core or magnetic field changes. Changes in mutual-inductance between the three location board magnetic field generating coils will also occur because the location board's three coils are superimposed. The magnetic field generated by any of the individual coils will necessarily result in an induced voltage in the other two coils. If a ferromagnetic object or any object that influences magnetic fields enters the sensing volume and changes the magnetic field, the change in the magnetic field will result in a change in the induced voltage. Hence, when the location board is being set up for use on a patient, an initial step of recording a baseline self and/or mutual inductance will provide a standard off of which an alarm condition may be defined. Thus, if the inductance varies from the baseline above a threshold value, a warning will be displayed that the system is potentially inaccurate. The signals used for measuring the inductance will be the same ones used for generating the magnetic field, one or more of the three frequencies (2.5, 3 & 3.5 Khz).

Another technique used by the present invention is to inject a signal into one or more of the sensor coils of the normally-passive locatable guide or patient sensor. This technique will be used to detect small changes in the magnetic field at the sensor vicinity, changes that the previous technique will not be able to detect. The self-inductance or mutual-inductance will be monitored the same way as in the location board, with two differences. The first difference is that the baseline inductances will be measured immediately after the sensor is manufactured and kept in an EEPROM that is part of the locatable guide and patient sensor. The second difference is that frequency of the signal used for the inductance measurement will be different than the one used by the system localization function.

The three coils of the location board are each creating magnetic fields on independent frequencies (e.g. 2.5 kHz, 3.0 kHz, and 3.5 kHz). Utilizing three different frequencies allows the sensors to distinguish between the three different fields and process the data accordingly. Injecting a signal into the sensor coils on a fourth frequency (e.g. 4.0 kHz) would create a small magnetic field that would cause an induced voltage in the other coils having a corresponding frequency. The system could monitor this induced voltage for changes above a threshold level, indicated some sort of magnetic interference. The electronic system reading the sensor signals is designed to prevent the 4 Khz signals from interrupting the localization signals (2, 3 & 3.5 Khz) by means of analog filtering, digital filtering and, if needed, time domain differentiation (the 4 khz signals are generated at a low duty cycle at specific intervals when the localization signals are not measured).

BRIEF DESCRIPTION OF THE DRAWINGS

FIG. 5a is a cutaway perspective view of an embodiment of a locatable guide of the present invention;

FIG. 5b is a circuit diagram of the locatable guide of FIG. 5a;

DETAILED DESCRIPTION OF THE INVENTION

Figure 1:
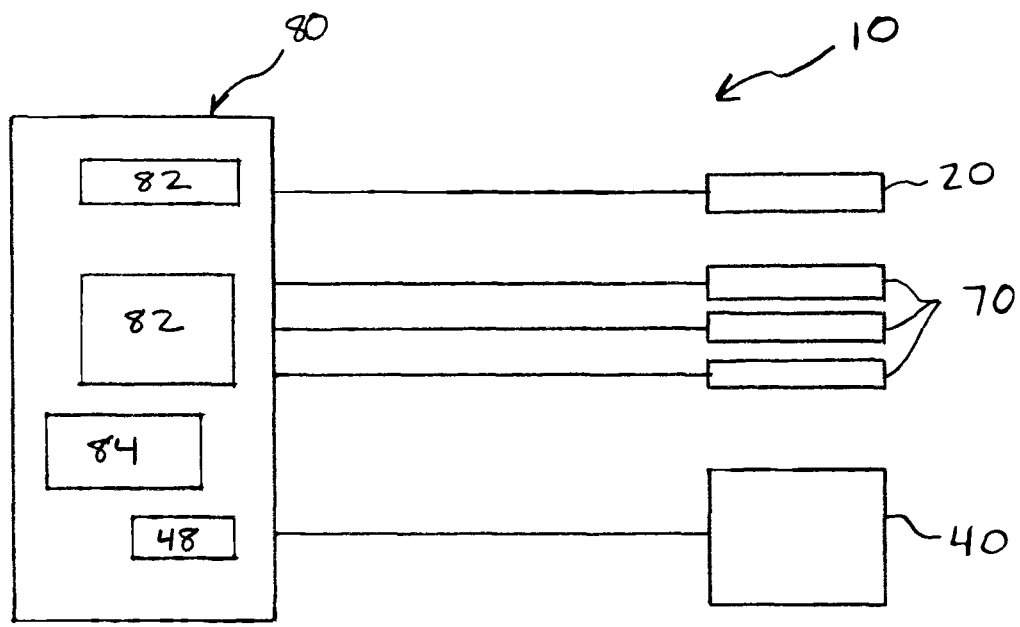
FIG. 1 is a diagram of an embodiment of a localization system of the present invention.

Referring now to the figures and first to FIG. 1, there is shown a location system 10 of the present invention. The location system 10 generally includes a locatable guide 20, a location board 40, a plurality of patient sensors 70, and a processing system 80.

Figure 4:
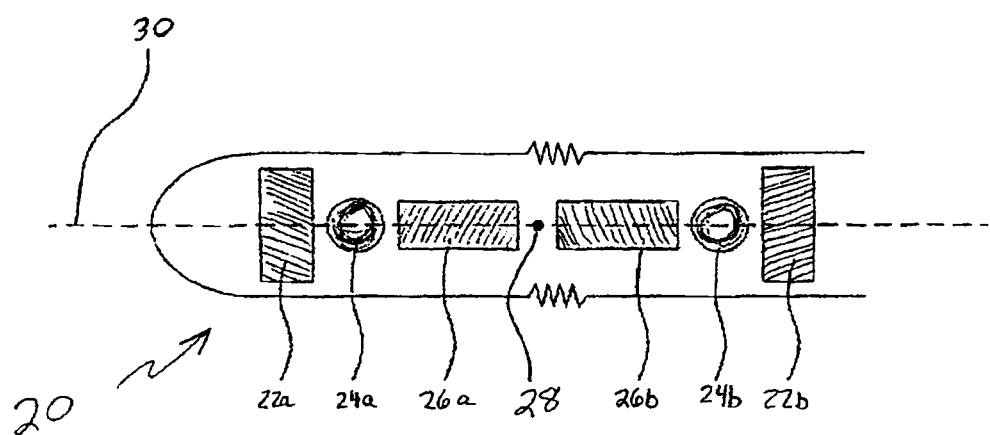
FIG. 4 is a diagram of an embodiment of a locatable guide of the present invention.

The locatable guide 20, as shown in FIGS. 4 and 5, is a probe having a receiver that generally includes a plurality of (preferably three) field component sensors 22, 24 and 26. Each of the field sensor components is arranged for sensing a different component of an electromagnetic field generated by the location board 40.

Figure 3:
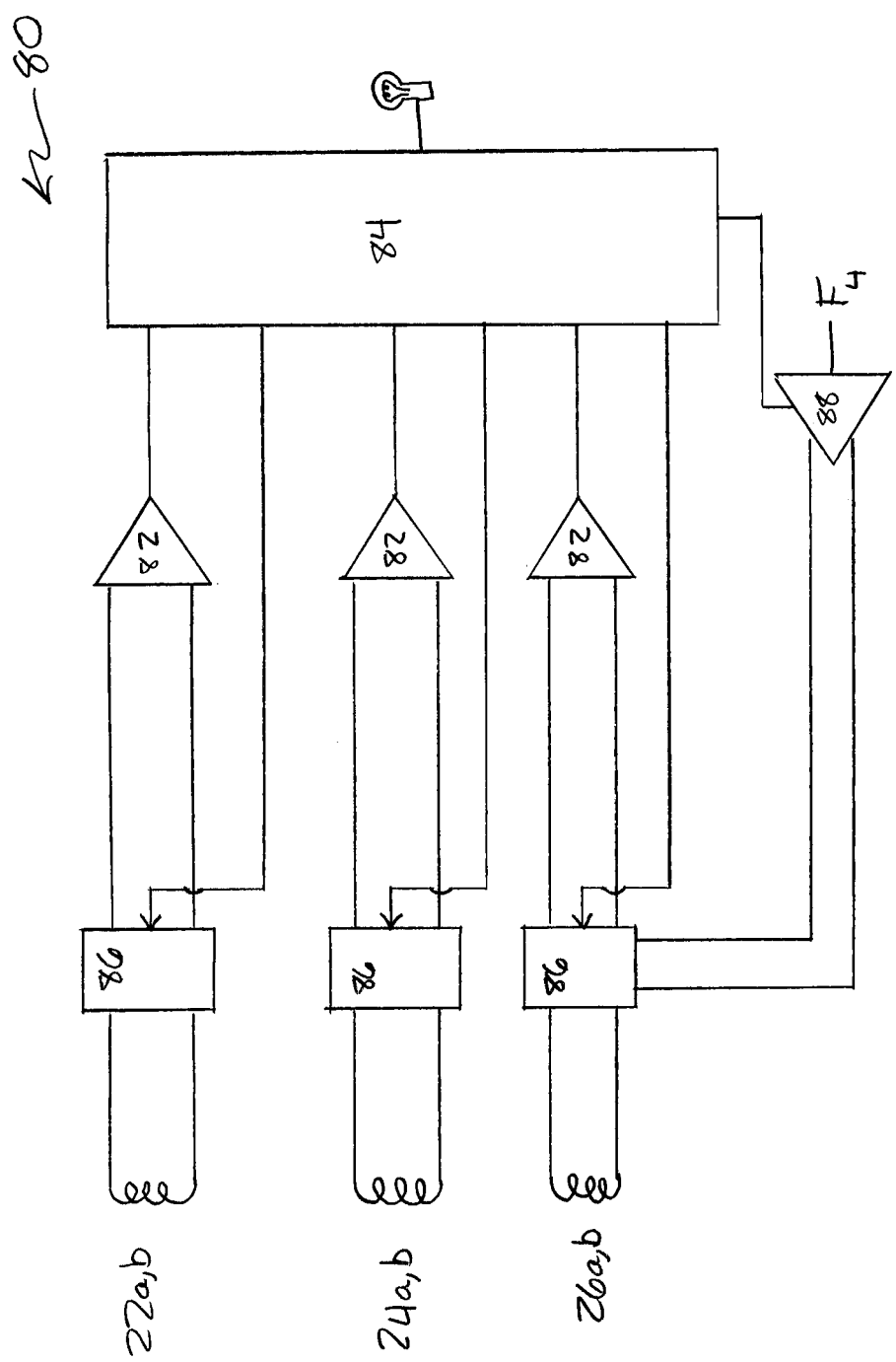
FIG. 3 is a diagram of an embodiment of a location board circuit of the present invention.

In one embodiment, shown in FIGS. 3 and 4, each field component sensor 22, 24 and 26 includes two sensor elements, 22a, 22b, 24a, 24b, 26a, and 26b, respectively. Typically, the sensor elements are coils of wire, and the sensed components are independent magnetic field components. The coils may be formed by wrapping wire around a core. The core may then be removed to form an air core at the center of the coil or may be left in place, forming a solid core coil. Preferably, the solid core coils are made of a material such as ferrite or another material having similar magnetic properties.

Preferably, the sensor elements 22, 24 and 26 are arranged in the locatable guide 20 such that the sensor elements 22a and 22b are on opposite sides of, and equidistant from, a common reference point 28. Similarly, sensor elements 24a and 24b are on opposite sides of, and equidistant from, point 28, and sensor elements 26a and 26b also are on opposite sides of, and equidistant from, point 28. In the illustrated example, the sensors 22, 24 and 26 are disposed collinearly along a longitudinal axis 30 of the locatable guide 20, but other configurations are possible.

For example, FIG. 5 shows a locatable guide 10 having field sensor components 22, 24 and 26'. Field sensor components 22 and 24 each have two sensor elements 22a and 22b, and 24a and 24b, respectively. Sensor elements 22a and 22b are on opposite sides of, and equidistant from, point 28. Sensor elements 24a and 24b are on opposite sides of, and equidistant from, point 28. However, field sensor component 26' consists of a single coil centered on point 28.

Figure 6:
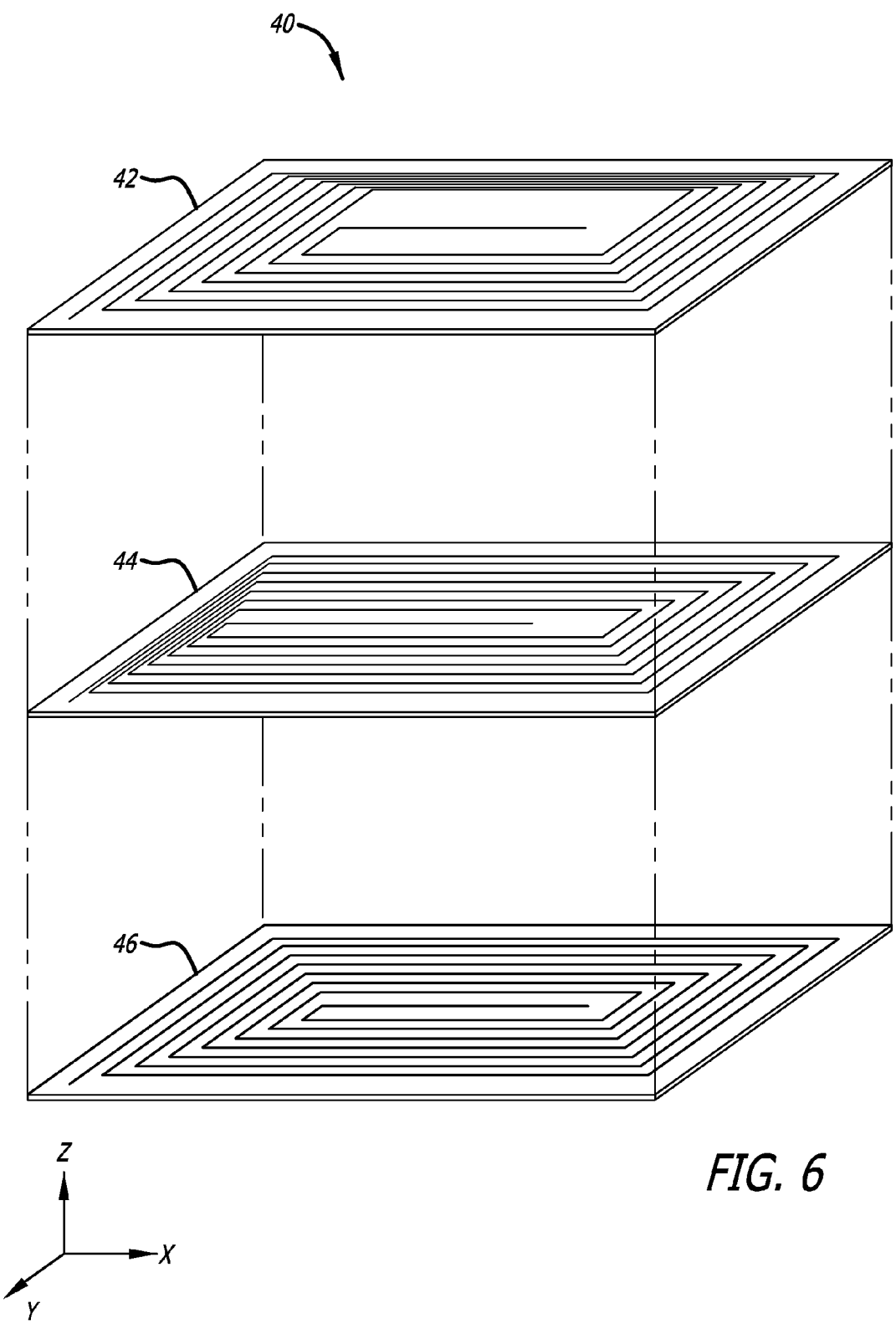
FIG. 6 is an expanded view of an embodiment of loop antennas of the present invention.

Referring again to FIG. 1, the location system 10 also includes the location board 40. The location board 40 is a transmitter of electromagnetic radiation. The location board 40 includes a stack of three substantially planar rectangular loop antennas 42, 44 and 46 connected to drive circuitry 48. FIG. 6 provides an expanded view of the loop antennas 42, 44 and 46 of the location board 40 in an expanded view to show the details of their configurations.

Antenna 42 is skewed in a y direction in that the loops on one side of the antenna 42 are closer together than the loops on the opposite side. Hence, antenna 42 creates a magnetic field that is stronger on the side where the loops are close together than it is on the opposite side. By measuring the strength of the current induced by the antenna 42 in the locatable guide 20, it can be determined where the locatable guide 20 is located in a y direction over the antenna 42.

Antenna 44 is similarly skewed but in an x direction. Hence, the antenna 44 also creates a magnetic field that is stronger on the side where the loops are closer together than it is on the opposite side. By measuring the strength of the current induced by the antenna 44 in the locatable guide 20, it can be determined where the locatable guide 20 is located in an x direction over the antenna 44.

Antenna 46 is not skewed. Rather, it creates a uniform field that naturally diminishes in strength in a vertical direction when the location board is horizontal. By measuring the strength of the field induced in the locatable guide 20, it can be determined how far the locatable guide is located above the antenna 46.

In order to distinguish one magnetic field from another, the fields of each antenna 42, 44 and 46 are generated using independent frequencies. For example, antenna 42 might be supplied with alternating current oscillating at 2.5 kHz, antenna 44 might be supplied with alternating current oscillating at 3.0 kHz, and antenna 46 might be supplied with alternating current oscillating at 3.5 kHz. Hence, each of the field sensors 22, 24, and 26 of the locatable guide will have three different alternating current signals induced in its coils. A person having ordinary skill in the art will realize that the location board design of the present invention is desirable in that the entire field generating device may be placed under the patient and out of the way. However, the interference detection aspect of the present invention may be practiced with other field generating designs, such as those incorporating field generating elements located in various positions around the patient.

Figure 2:
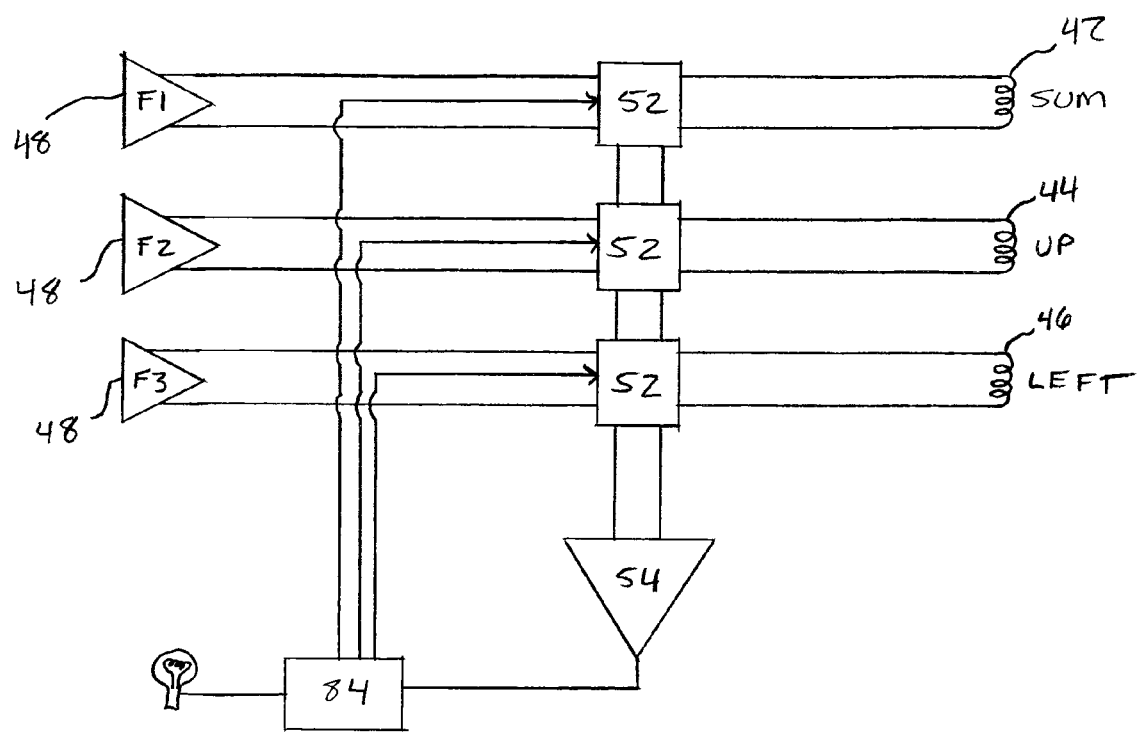
FIG. 2 is a diagram of an embodiment of a location board circuit of the present invention.

Referring to FIG. 2, driving circuitry 48 includes appropriate signal generators and amplifiers for driving current in each of the loop antennas 42, 44 and 46 at their corresponding frequencies. The electromagnetic waves generated by the location board 40 are received by the locatable guide 20 and converted into electrical signals that are then sent to the processing system 80, shown diagrammatically in FIGS. 1 and 3.

The processing system 80 generally includes reception circuitry 82 that has appropriate amplifiers and A/D converters. The reception circuitry 82 and the driving circuitry 48, which may be considered part of the control system 80, are controlled by a controller/processor 84 that typically is an appropriately programmed micro-controller and logic circuits. The controller/processor 84 directs the generation of transmitted signals by driving circuitry 48.

One embodiment of the present invention involves detecting the presence of a disturbance in the magnetic fields created by the location board 40 by monitoring the self or mutual inductance of the loop antennas 42, 44 and 46. As stated above, each loop antenna 42, 44 and 46 operates on a different frequency in order to allow distinction by the control system 80. Because each loop antenna 42, 44 and 46 is creating an independent magnetic field, AC voltages at the respective frequencies of the loop antennas are also being induced into each loop antenna from the other two and also a self induced voltage created by the loops own current (self-inductance). In other words, if loop antenna 42 is operating a 2.5 kHz, for example, it is creating a magnetic field that oscillates at 2.5 kHz. This oscillating magnetic field then will induce an alternating electrical voltage in loop antennas 44 and 46 and also onto itself that has a frequency of 2.5 kHz. The magnetic fields created by loop antennas 44 and 46 similarly create alternating electrical voltages in the other loop antennas.

These induced voltages are proportional to characteristics called self inductance (for the self induced voltage) and mutual inductance (for the voltage induced in one loop due to current flowing in another loop). They are dependant on the geometric configuration and materials of the location board and on the conducting materials in the environment close to the location board. If a conductive object enters the magnetic fields close enough to the location board loops the self and mutual inductances will change, the induced signals in each loop antenna will correspondingly change. Hence, by monitoring the baseline induced voltage in one, two, or all three loop antennas 42, 44 and 46, a change attributable to the presence of a foreign object may be used as an indicator that the data being generated by the system 10 should be considered compromised.

The circuit enabling measurement of the induced voltages includes voltage pickup circuits 52, connected between the location board loops 42, 44 and 46 and the system current drivers 48. They pick up the voltages induced and feed them into an amplifier/converter 54 that sends the signals for processing in the signal processing 84 part of the system. The processing system 80 includes circuitry to control the voltage pickup circuitry as to which of the loop's signals will be fed into the amplifier 54.

Since the system is installed on a bronchoscopy table which has metal parts and has an effect on the magnetic field and the location board's self and mutual inductance. Upon system installation a threshold level equivalent to the self and/or mutual inductance is set. Changes of the self and/or mutual inductance which are above the threshold level by a certain level, depending on the noise characteristics will result in an alert. Preferably, this alert will be in the form of an audible tone, a video signal, or both. The alert will signal the physician that the bronchoscopy table configuration has changed from the original installation configuration, or a metal, or other interfering object, has entered the magnetic field or is in close enough proximity thereto to compromise the integrity of the data being generated by the system. The physician then knows to determine the source of the interference and remove it, or proceed with the procedure without giving undue deference to the compromised data.

A second embodiment of the present invention involves detecting the presence of a disturbance in the magnetic fields in the vicinity of the sensor (LG or patient sensor) by monitoring the self and/or mutual inductance change of sensors components 22, 24 and 26. Similar to the first embodiment, currents are driven into one of the coils and the voltage induced is measured on all the coils.

The sensor section of the localization system does not include mechanisms for driving current into the sensor coils; a circuitry is added that drives this current into the coils—injected signal. The circuitry included an alternating current generator (in frequency F4 different from F1, F2 & F3) 88 and controlled current feeder circuits 86. The signal processing section 84 controls the current feeders 86 and determine into which of the coils the current is injected. The sensor's amplifiers and converter circuits 82 that are used for measuring the localization signals (induced from the location board 40) are also used to amplify the F4 induced voltage.

In order to prevent interference with the magnetic fields being generated by the location board 40, the injected signal will preferably have a frequency that is distinct from the operating frequencies of the loop antennas 42, 44 and 46. For example, if the loop antennas 42, 44 and 46 are operating at 2.5, 3.0, and 3.5 kHz (F1, F2 & F3), the injected signal could be at 4.0 kHz (F4).

Preferably, since the location amplifier converters 82 may get interfered by the strong level of the F4 signal compared to the localization signals (F1, F2 & F3) induced from the location board 40, and create a false location measurement, the injected signal will be sent to the locatable guide sensor 20 or patient sensor 70 at very low duty cycles, every few seconds for a few milliseconds each time, during that time the calculation of the location is ignored by the system. A baseline inductance response in each field component sensor 22, 24 and 26 will be recorded in a magnetically clean environment during the production of the sensor (locatable guide or patient sensor). Hence, by monitoring the inductance response to the injected signal and comparing it to the baseline induced signal in one, two, or all three field component sensors 22, 24 and 26, a change attributable to the presence of a foreign object may be used as an indicator that the data being generated by the system 10 should be considered compromised and an alert is generated.

Preferably, this alert will be in the form of an audible tone, a video signal, or both. The alert will signal the physician that a metal, or other interfering object, has entered the magnetic field or is in close enough proximity to the sensor and thereto to compromise the integrity of the data being generated by the system. The physician then knows to determine the source of the interference and remove it, or proceed with the procedure without giving undue deference to the compromised data.

A third embodiment of the present invention involves detecting the presence of a disturbance in the magnetic fields created by the location board 40 by monitoring the inductance generated in the field component sensors 22, 24 and 26, similar to the second embodiment, except that the inductance being monitored occurs in the loop antennas 42, 44 and 46 of the location board 40. As stated above, each loop antenna 42, 44 and 46 operates on a different frequency in order to allow distinction by the control system 80. Because each loop antenna 42, 44 and 46 is creating an independent magnetic field, AC currents at the respective frequencies of the loop antennas are also being induced into each of the field component sensors 22, 24, and 26. For example, if antenna 42 operates at 2.5 kHz, antenna 44 operates at 3.0 kHz, and antenna 46 operates at 3.5 kHz, then each field component sensor 42, 44 and 46 has corresponding alternating current signals in all three frequencies being induced and sent to the control system 80. The field component sensors are passive in that electricity is not being supplied to them, rather, all of the current traveling through them is induced.

However, according to the second embodiment of the present invention, a magnetic field can be generated by one or more of the field component sensors 22, 24 and 26, by sending electricity through their coils. If a short, electric signal is sent to one or more of the sensors, the result will be the generation of a magnetic field having a corresponding frequency. This magnetic field will, in turn, induce an electrical signal in the loop antennas 42, 44 and 46 of the location board 40. The induced electrical signal in loop antennas 42, 44 and 46 will have the same frequency as the electrical signal sent to the locatable guide 20.

In order to prevent interference with the magnetic fields being generated by the location board 40, the injected signal will preferably have a frequency that is distinct from the operating frequencies of the loop antennas 42, 44 and 46. For example, if the loop antennas 42, 44 and 46 are operating at 2.5, 3.0, and 3.5 kHz, the injected signal could be at 4.0 kHz.

Preferably, the injected signal will be sent to the locatable guide 20 every few seconds for a few milliseconds each time. A baseline inductance response in each loop antenna 42, 44 and 46 will be recorded in a magnetically clean environment with the location board 40 operating. The magnetic fields of the location board 40 will impact the induced signals corresponding to the injected signal. Hence, if an object enters the magnetic fields and changes them, the induced signals in the loop antennas 42, 44 and 46 will correspondingly change. Hence, by monitoring the inductance response to the injected signal and comparing it to the baseline induced signal in one, two, or all three loop antennas 42, 44 and 46, a change attributable to the presence of a foreign object may be used as an indicator that the data being generated by the system 10 should be considered compromised and an alert is generated.

Preferably, this alert will be in the form of an audible tone, a video signal, or both. The alert will signal the physician that a metal, or other interfering object, has entered the magnetic field or is in close enough proximity thereto to compromise the integrity of the data being generated by the system. The physician then knows to determine the source of the interference and remove it, or proceed with the procedure without giving undue deference to the compromised data.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

I claim:

1. A method of detecting a presence of a foreign object in an operating space of an electromagnetic localization system, the method comprising:
    creating a plurality of magnetic fields with a plurality of loop antennas, the magnetic fields including a first non-uniform magnetic field, a second non-uniform magnetic field, and a uniform magnetic field; the magnetic fields inducing an electrical currents in a plurality location sensor coils of a medical instrument and having at least one field frequency,
    wherein first, second, and third loop antennas of the plurality of loop antennas are positioned in planes, parallel with one another, and are superimposed on each other, the superimposition being in a direction perpendicular to the planes,
    wherein the first loop antenna has a plurality of loops and the plurality of loops of the first loop antenna on a first side of the first loop antenna are closer together than the plurality of loops of the first loop antenna on sides other than the first side of the first loop antenna, the first loop antenna creating the first non-uniform magnetic field,
    wherein the second loop antenna has a plurality of loops and the plurality of loops of the second loop antenna on a first side of the second loop antenna, different from the first side of the first loop antenna, are closer together than the plurality of loops of the second loop antenna on sides other than the first side of the second loop antenna, the second loop antenna creating the second non-uniform magnetic field, and
    wherein the third loop antenna has a plurality of loops and the plurality of loops of the third loop antenna are uniformly distanced on all sides of the third loop antenna, the third loop antenna creating the uniform magnetic field;
    calculating a location of the medical instrument based on the induced electrical currents in the location sensor coils;
    injecting a signal into one of the location sensor coils at an injection frequency that is distinct from the at least one field frequency; and
    monitoring changes in a first inductance of at least one of the plurality of loop antennas at the injection frequency due to a foreign object,
    wherein the calculation of the location of the medical instrument is ignored while the signal is injected.

2. The method of claim 1, wherein the monitoring changes in the first inductance further includes monitoring changes in mutual-inductance between at least two of the plurality of loop antennas.

3. The method of claim 1, wherein the monitoring changes in the first inductance further includes monitoring changes in self-inductance of the at least one of the plurality of loop antennas.

4. The method of claim 1, wherein the monitoring changes in the first inductance further includes:
    recording a baseline inductance of at least one of the plurality of loop antennas; and
    comparing the first inductance against the baseline inductance to determine a difference.

5. The method of claim 4, further comprising:
    setting a threshold difference value; and
    defining an alarm condition above the threshold difference value indicating the difference determined in the comparison is above the threshold difference value.

6. The method of claim 5, further comprising alerting a user whenever the alarm condition exists.

7. A method of detecting a presence of a foreign object in an operating space of an electromagnetic localization system, the method comprising:
    creating a plurality of magnetic fields with a plurality of loop antennas, the magnetic fields including a first non-uniform magnetic field, a second non-uniform magnetic field, and a uniform magnetic field; the magnetic fields inducing electrical currents in a plurality of location sensor coils of a medical instrument and having at least one field frequency,
    wherein first, second, and third loop antennas of the plurality of loop antennas are positioned in planes, parallel with one another, and are superimposed on each other, the superimposition being in a direction perpendicular to the planes,
    wherein the first loop antenna has a plurality of loops and the plurality of loops of the first loop antenna on a first side of the first loop antenna are closer together than the plurality of loops of the first loop antenna on sides other than the first side of the first loop antenna, the first loop antenna creating the first non-uniform magnetic field, wherein the second loop antenna has a plurality of loops and the plurality of loops of the second loop antenna on a first side of the second loop antenna different from the first side of the first loop antenna are closer together than the plurality of loops of the second loop antenna on sides other than the first side of the second loop antenna, the second loop antenna creating the second non-uniform magnetic field, and wherein the third loop antenna has a plurality of loops and the plurality of loops of the third loop antenna are uniformly distanced on all sides of the third loop antenna, the third loop antenna creating the uniform magnetic field;

calculating a location of the medical instrument based on the induced electrical currents in the plurality of location sensor coils;

repeatedly injecting signals into at least one of the plurality of location sensor coils at an injection frequency that is distinct from the at least one field frequency;

monitoring inductance of at least one of the plurality of loop antennas resulting from one of the injected signals; and comparing the monitored inductance against a baseline inductance of the at least one of the plurality of loop antennas to determine a presence of a foreign object compromising accuracy of the electromagnetic localization system, wherein the calculation of the location of the medical instrument is ignored while the signals are repeatedly injected.

8. The method of claim 7, wherein the monitoring the inductance includes monitoring self inductance of the at least one of the plurality of loop antennas.

9. The method of claim 7, wherein the monitoring the inductance includes monitoring mutual inductance between at least two of the plurality of loop antennas.

10. The method of claim 7, wherein the at least one field frequency includes three field frequencies spaced apart by a frequency difference, and wherein the injection frequency is spaced apart from one of the three field frequencies by the frequency difference.

11. The method of claim 10, wherein the frequency difference is about 500 Hz.

12. The method of claim 7, wherein the repeatedly injecting signals include using circuitry that includes an alternating current generator to inject one of the injected signals.

13. The method of claim 7, further comprising:

setting a threshold difference value; and defining an alarm condition as a difference value obtained from the comparison of the monitored inductance and the baseline inductance that is above the threshold difference value.

14. The method of claim 13, further comprising alerting a user whenever the alarm condition exists.

* * * * *